United States Patent
Grajcar

(10) Patent No.: US 8,643,308 B2
(45) Date of Patent: *Feb. 4, 2014

(54) SPECTRAL SHIFT CONTROL FOR DIMMABLE AC LED LIGHTING

(75) Inventor: Zdenko Grajcar, Crystal, MN (US)

(73) Assignee: Once Innovations, Inc., Plymouth, MN (US)

(*) Notice: Subject to any disclaimer, the term of this patent is extended or adjusted under 35 U.S.C. 154(b) by 418 days.

This patent is subject to a terminal disclaimer.

(21) Appl. No.: 12/824,215

(22) Filed: Jun. 27, 2010

(65) Prior Publication Data

US 2011/0210678 A1 Sep. 1, 2011

Related U.S. Application Data

(63) Continuation-in-part of application No. 12/785,498, filed on May 24, 2010, now Pat. No. 8,373,363.

(60) Provisional application No. 61/233,829, filed on Aug. 14, 2009, provisional application No. 61/234,094, filed on Aug. 14, 2009.

(51) Int. Cl.
*H05B 37/02* (2006.01)
(52) U.S. Cl.
USPC ........ 315/307; 315/185 R; 315/192; 315/291; 315/294; 315/312
(58) Field of Classification Search
USPC ............. 315/185 R, 194, 195, 291, 294, 297, 315/307, 312, 192
See application file for complete search history.

(56) References Cited

U.S. PATENT DOCUMENTS

| | | | |
|---|---|---|---|
| 6,636,003 B2 * | 10/2003 | Rahm et al. | 315/179 |
| 6,933,707 B2 | 8/2005 | Allen | |
| 7,038,399 B2 | 5/2006 | Lys et al. | |
| 7,102,334 B2 | 9/2006 | Wiegand et al. | |

(Continued)

FOREIGN PATENT DOCUMENTS

EP 1502483 A1 2/2005

OTHER PUBLICATIONS

International Preliminary Report on Patentability, issued in International Patent Application No. PCT/US2010/045467, dated Feb. 14, 2012.

(Continued)

*Primary Examiner* — Douglas W Owens
*Assistant Examiner* — Thai Pham
(74) *Attorney, Agent, or Firm* — McDermott Will & Emery LLP

(57) ABSTRACT

Apparatus and associated methods involve operation of an LED light engine in which a relative intensities of selected wavelengths shift as a function of electrical excitation. In an illustrative example, current may be selectively and automatically diverted substantially away from at least one of a number of LEDs arranged in a series circuit until the current or its associated periodic excitation voltage reaches a predetermined threshold level. The diversion current may be smoothly reduced in transition as the excitation current or voltage rises substantially above the predetermined threshold level. A color temperature of the light output may be substantially changed as a predetermined function of the excitation voltage. For example, some embodiments may substantially increase or decrease a color temperature output by a solid state light engine in response to dimming the AC voltage excitation (e.g., by phase-cutting or amplitude modulation).

17 Claims, 31 Drawing Sheets

(56) References Cited

U.S. PATENT DOCUMENTS

| | | | |
|---|---|---|---|
| 7,102,344 B1* | 9/2006 | Short | 324/66 |
| 7,288,902 B1* | 10/2007 | Melanson | 315/291 |
| 7,352,138 B2 | 4/2008 | Lys et al. | |
| 7,358,679 B2 | 4/2008 | Lys et al. | |
| 7,378,805 B2 | 5/2008 | Oh et al. | |
| 7,391,630 B2 | 6/2008 | Acatrinei | |
| 7,425,801 B2 | 9/2008 | Ozaki | |
| 7,489,086 B2 | 2/2009 | Miskin et al. | |
| 7,709,774 B2 | 5/2010 | Schulz et al. | |
| 7,737,643 B2 | 6/2010 | Lys | |
| 7,791,289 B2 | 9/2010 | Oosterbaan et al. | |
| 7,859,196 B2 | 12/2010 | Lee et al. | |
| 7,863,831 B2 | 1/2011 | Vos | |
| 7,977,892 B2 | 7/2011 | Lee et al. | |
| 8,120,279 B2 | 2/2012 | Oosterbaan et al. | |
| 8,134,303 B2* | 3/2012 | Lys | 315/291 |
| 8,159,125 B2* | 4/2012 | Miao | 313/498 |
| 8,188,679 B2 | 5/2012 | Hoogzaad | |
| 8,188,687 B2 | 5/2012 | Lee et al. | |
| 2007/0258240 A1* | 11/2007 | Ducharme et al. | 362/231 |
| 2008/0211421 A1* | 9/2008 | Lee et al. | 315/250 |
| 2010/0060175 A1 | 3/2010 | Lethellier | |
| 2010/0164579 A1 | 7/2010 | Acatrinei | |
| 2010/0308739 A1 | 12/2010 | Shteynberg et al. | |
| 2010/0308751 A1 | 12/2010 | Nerone | |
| 2011/0031890 A1* | 2/2011 | Stack | 315/228 |
| 2011/0037415 A1* | 2/2011 | Juestel et al. | 315/297 |
| 2011/0101883 A1 | 5/2011 | Grajcar | |
| 2011/0109244 A1 | 5/2011 | Grajcar | |
| 2011/0210678 A1 | 9/2011 | Grajcar | |
| 2012/0081009 A1* | 4/2012 | Shteynberg et al. | 315/122 |

OTHER PUBLICATIONS

International Search Report, issued in International Patent Application No. PCT/US2010/045467, dated Oct. 7, 2010.

"Hazards of Harmonics and Neutral Overloads", White Paper #26, 2003, pp. 1-8, American Power Conversion.

United States Notice of Allowance issued in U.S. Appl. No. 12/785,498 dated Jun. 29, 2012.

Notice of Allowance issued in U.S. Appl. No. 12/785,498, mailed on Dec. 26, 2012.

* cited by examiner

| Power Quality | | | | | |
|---|---|---|---|---|---|
| | Value | Mean | Min | Max | Std Dev |
| V RMS | 119.9V | 119.8 | 119.8 | 119.9 | 11.22 m |
| V Crest Factor | 1.430 | 1.434 | 1.430 | 1.440 | 3.674 m |
| Frequency | 59.99 Hz | 59.99 | 59.98 | 60.01 | 11.79 m |
| I RMS | 64.30 mA | 64.29 m | 64.27 m | 64.30 m | 14.16μ |
| I Crest Factor | 1.596 | 1.600 | 1.596 | 1.610 | 5.274 m |
| True Power | 7.608 W | 7.605 | 7.601 | 7.608 | 2.581 m |
| Apparent Power | 7.707 VA | 7.705 | 7.701 | 7.707 | 2.394 m |
| Reactive Power | 1.234 VAR | 1.234 | 1.233 | 1.237 | 1.352 m |
| Power Factor | 987.1 m | 987.1 m | 987.0 m | 987.1 m | 34.58 μ |
| Phase Angle | 9.212 ° | 9.216 | 9.210 | 9.242 | 12.36 m |

| Harmonics | | | | |
|---|---|---|---|---|
| THD-F | 16.1% | | | |
| THD-R | 15.8% | | | |
| RMS | 64.1 mA | | | |
| | Freq (Hz) | Mag (%) | Mag RMS (A) | Phase (°) |
| 1 | 59.97 | 100 | 63.3m | 0.00 |
| 3 | 179.9 | 3.64 | 2.30m | 174 |
| 5 | 299.8 | 5.31 | 3.36m | -5.53 |
| 7 | 419.8 | 11.1 | 7.05m | 179 |
| 9 | 539.7 | 7.93 | 5.01m | -180 |
| 11 | 659.6 | 2.71 | 1.71m | -178 |
| 13 | 779.6 | 1.78 | 1.12m | 171 |
| 15 | 899.5 | 1.28 | 808μ | 3.82 |
| 17 | 1.019k | 3.18 | 2.10m | -1.03 |
| 19 | 1.139.k | 1.82 | 1.15m | 1.48 |
| Use 'Harmonics → Display → Select' to select a harmonic | | | | |

| Power Quality | | | | | |
|---|---|---|---|---|---|
| | Value | Mean | Min | Max | Std Dev |
| V RMS | 120.4 V | 97.94 | 94.07 | 120.5 | 9.400 |
| V Crest Factor | 1.428 | 2.693 | 1.428 | 4.409 | 1.339 |
| Frequency | 59.99 Hz | 26.26k | 59.96 | 416.7k | 83.98k |
| I RMS | 148.0mA | 50.47m | 2.365m | 148.0m | 57.52m |
| I Crest Factor | 1.775 | 2.581 | 1.524 | 5.604 | 1.122 |
| True Power | 17.23 W | 17.21 | 17.18 | 17.23 | 21.93m |
| Apparent Power | 17.82 VA | 5.045 | 18.43µ | 17.82 | 7.085 |
| Reactive Power | 4.549 VAR | 4.538 | 4.531 | 4.549 | 6.918m |
| Power Factor | 966.9m | 966.9m | 966.9m | 967.0m | 65.99µ |
| Phase Angle | 14.79 ° | 14.77 | 14.76 | 14.79 | 14.83m |

| Power Quality | | | | | |
|---|---|---|---|---|---|
| | Value | Mean | Min | Max | Std Dev |
| V RMS | 120.4 V | 120.1 | 94.07 | 120.5 | 2.771 |
| V Crest Factor | 1.431 | 1.917 | 1.427 | 4.409 | 1.034 |
| Frequency | 60.01 Hz | 10.15k | 59.87 | 416.7k | 53.41k |
| I RMS | 129.6mA | 110.7m | 2.365m | 155.1m | 60.33m |
| I Crest Factor | 1.511 | 2.065 | 1.511 | 5.604 | 810.5m |
| True Power | 15.26 W | 15.25 | 15.24 | 15.26 | 7.192m |
| Apparent Power | 15.60 VA | 12.93 | 18.43µ | 18.68 | 7.732 |
| Reactive Power | 3.271 VAR | 3.273 | 3.270 | 3.282 | 5.985m |
| Power Factor | 977.8m | 977.7m | 977.6m | 977.8m | 98.38µ |
| Phase Angle | 12.10° | 12.11 | 12.09 | 12.15 | 26.84m |

| Power Quality | | | | | |
|---|---|---|---|---|---|
| | Value | Mean | Min | Max | Std Dev |
| V RMS | 121.1 V | 115.7 | 2.710m | 121.2 | 23.06 |
| V Crest Factor | 1.424 | 1.506 | 1.420 | 4.428 | 470.2m |
| Frequency | 60.04 Hz | 3.686k | 59.95 | 156.3k | 22.12k |
| I RMS | 25.66mA | 24.64m | 496.6µ | 25.66m | 4.012m |
| I Crest Factor | 1.620 | 1.746 | 1.592 | 9.367 | 897.4m |
| True Power | 3.042 W | 3.042 | 3.039 | 3.043 | 1.398m |
| Apparent Power | 3.107 VA | 2.939 | 19.87µ | 3.109 | 634.8m |
| Reactive Power | 633.0mVA | 633.3m | 633.0m | 633.7m | 292.2µ |
| Power Factor | 979.0m | 979.0m | 978.9m | 979.0m | 35.52µ |
| Phase Angle | 11.75° | 11.76 | 11.75 | 11.78 | 9.980m |

| THD-F | 20.9 % | | |
|---|---|---|---|
| THD-R | 20.5 % | | |
| RMS | 25.7mA | | |
| | Freq (Hz) | Mag (%) | Mag RMS (A) | Phase (°) |
| 1 | 59.98 | 100 | 25.1m | 0.00 |
| 3 | 179.9 | 7.29 | 1.83m | 179 |
| 5 | 299.9 | 494m | 124μ | −28.6 |
| 7 | 419.9 | 15.9 | 4.01m | 179 |
| 9 | 539.8 | 6.60 | 1.66m | 180 |
| 11 | 659.8 | 733m | 184μ | 1.06 |
| 13 | 779.8 | 2.68 | 674μ | 1.68 |
| 15 | 899.7 | 5.53 | 1.39m | −1.28 |
| 17 | 1.020k | 3.35 | 843μ | −2.53 |
| 19 | 1.140k | 916m | 230μ | −178 |

| Voltage | Line LEDS Lm | Bypass LED Lm | Lm Total |
|---|---|---|---|
| 120 | 499.70 | 236.50 | 736.2 |
| 115 | 464.70 | 192.90 | 657.6 |
| 110 | 440.90 | 148.40 | 589.3 |
| 105 | 428.90 | 102.90 | 531.8 |
| 100 | 416.20 | 61.88 | 478.08 |
| 95 | 401.70 | 26.96 | 428.66 |
| 90 | 385.90 | 5.74 | 391.637 |
| 85 | 368.30 | 3.17 | 371.473 |
| 80 | 347.50 | 2.98 | 350.482 |
| 75 | 324.20 | 2.77 | 326.968 |
| 70 | 303.10 | 2.53 | 305.629 |
| 65 | 264.00 | 2.01 | 266.01 |
| 60 | 212.30 | 1.47 | 213.77 |
| 55 | 132.50 | 0.00 | 132.5 |
| 50 | 24.27 | 0.00 | 24.27 |
| 45 | -0.00 | 0 | -0.00494 |
| 40 | 0.00 | 0 | 0 |
| 35 | 0.00 | 0 | 0 |

SPECTRAL SHIFT CONTROL FOR DIMMABLE AC LED LIGHTING

CROSS-REFERENCE TO RELATED APPLICATIONS

This application claims the benefit of the filing date of the following: U.S. Provisional Patent Application entitled "Reduction of Harmonic Distortion for LED Loads," Ser. No. 61/233,829, which was filed by Z. Grajcar on Aug. 14, 2009; U.S. patent application entitled "Reduction of Harmonic Distortion for LED Loads," Ser. No. 12/785,498, which was filed by Z. Grajcar on May 24, 2010; and, U.S. Provisional Patent Application entitled "Color Temperature Shift Control for Dimmable AC LED Lighting," Ser. No. 61/234,094, which was filed by Z. Grajcar on Aug. 14, 2009, the entire contents of each of which are incorporated herein by reference.

TECHNICAL FIELD

Various embodiments relate generally to lighting systems that include light emitting diodes (LEDs).

BACKGROUND

Power factor is important to utilities who deliver electrical power to customers. For two loads that require the same level of real power, the load with the better power factor actually demands less current from the utility. A load with a 1.0 power factor requires the minimum amount of current from the utility. Utilities may offer a reduced rate to customers with high power factor loads.

A poor power factor may be due to a phase difference between voltage and current. Power factor can also be degraded by distortion and harmonic content of the current. In some cases, distorted current waveforms tend to increase the harmonic energy content, and reduce the energy at the fundamental frequency. For a sinusoidal voltage waveform, only the energy at the fundamental frequency may transfer real power to a load. Distorted current waveforms can result from non-linear loads such as rectifier loads. Rectifier loads may include, for example, diodes such as LEDs, for example.

LEDs are widely used device capable of illumination when supplied with current. For example, a single red LED may provide a visible indication of operating state (e.g., on or off) to an equipment operator. As another example, LEDs can be used to display information in some electronics-based devices, such as handheld calculators. LEDs have also been used, for example, in lighting systems, data communications and motor controls.

Typically, an LED is formed as a semiconductor diode having an anode and a cathode. In theory, an ideal diode will only conduct current in one direction. When sufficient forward bias voltage is applied between the anode and cathode, conventional current flows through the diode. Forward current flow through an LED may cause photons to recombine with holes to release energy in the form of light.

The emitted light from some LEDs is in the visible wavelength spectrum. By proper selection of semiconductor materials, individual LEDs can be constructed to emit certain colors (e.g., wavelength), such as red, blue, or green, for example.

In general, an LED may be created on a conventional semiconductor die. An individual LED may be integrated with other circuitry on the same die, or packaged as a discrete single component. Typically, the package that contains the LED semiconductor element will include a transparent window to permit the light to escape from the package.

SUMMARY

Apparatus and associated methods involve operation of an LED light engine in which a relative intensities of selected wavelengths shift as a function of electrical excitation. In an illustrative example, current may be selectively and automatically diverted substantially away from at least one of a number of LEDs arranged in a series circuit until the current or its associated periodic excitation voltage reaches a predetermined threshold level. The diversion current may be smoothly reduced in transition as the excitation current or voltage rises substantially above the predetermined threshold level. A color temperature of the light output may be substantially changed as a predetermined function of the excitation voltage. For example, some embodiments may substantially increase or decrease a color temperature output by a solid state light engine in response to dimming the AC voltage excitation (e.g., by phase-cutting or amplitude modulation).

In various examples, selective current diversion within the LED string may extend the input current conduction angle and thereby substantially improve power factor and/or reduce harmonic distortion for AC LED lighting systems.

Various embodiments may achieve one or more advantages. For example, some embodiments may substantially reduce harmonic distortion on the AC input current waveform using, for example, very simple, low cost, and low power circuitry. In some embodiments, the additional circuitry to achieve substantially reduced harmonic distortion may include a single transistor, or may further include a second transistor and a current sense element. In some examples, a current sensor may be a resistive element through which a portion of an LED current flows. In some embodiments, significant size and manufacturing cost reductions may be achieved by integrating the harmonic improvement circuitry on a die with one or more LEDs controlled by harmonic improvement circuitry. In certain examples, harmonic improvement circuitry may be integrated with corresponding controlled LEDs on a common die without increasing the number of process steps required to manufacture the LEDs alone. In various embodiments, harmonic distortion of AC input current may be substantially improved for AC-driven LED loads, for example, using either half-wave or full-wave rectification. Some implementations may require as few as two transistors and three resistors to provide a controlled bypass path to condition the input current for improved power quality in an AC LED light engine. Some implementations may provide a predetermined increase, decrease, or substantially constant color temperature over a selected range of input excitation.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is generally organized as follows. First, to help introduce discussion of various embodiments, a lighting system with a full-wave rectifier topology using LEDs is introduced with reference to FIGS. 1-5. Second, that introduction leads into a description with reference to FIGS. 6-9 of some exemplary embodiments of the full-wave rectifier lighting system with selective current diversion for improved power factor capability. Third, with reference to FIGS. 10-13, selective current diversion is described in application to exemplary LED strings configured for half-wave rectification. Fourth, with reference to FIGS. 14-19, the discussion turns to exemplary embodiments that illustrate selective current diversion applied to LEDs strings using conventional (e.g., non-LED) rectifiers. Fifth, and with reference to FIG. 20, this document describes exemplary apparatus and methods useful for calibrating or testing power factor improvements in embodiments of the lighting apparatus. Sixth, this disclosure turns to a review of experimental data and a discussion of two AC LED light engine topologies. One topology is reviewed with reference to FIGS. 21-25. A second topology in three different embodiments (e.g., three different component selections) is reviewed with reference to FIGS. 26-37. Seventh, the document introduces a number of different topologies, with reference to FIGS. 38-43, for AC LED light engine that incorporate selective current diversion to condition the input current waveform.

Eighth, this disclosure explains, with reference to the remaining Figures, examples to illustrate how AC LED light engines can be configured with selective current diversion, in various embodiments as described herein, to provide a desired shift in color temperature in response to changes in input excitation (e.g., dimming). Finally, the document discusses further embodiments, exemplary applications and aspects relating to improved power quality for AC LED lighting applications.

Figure 1:
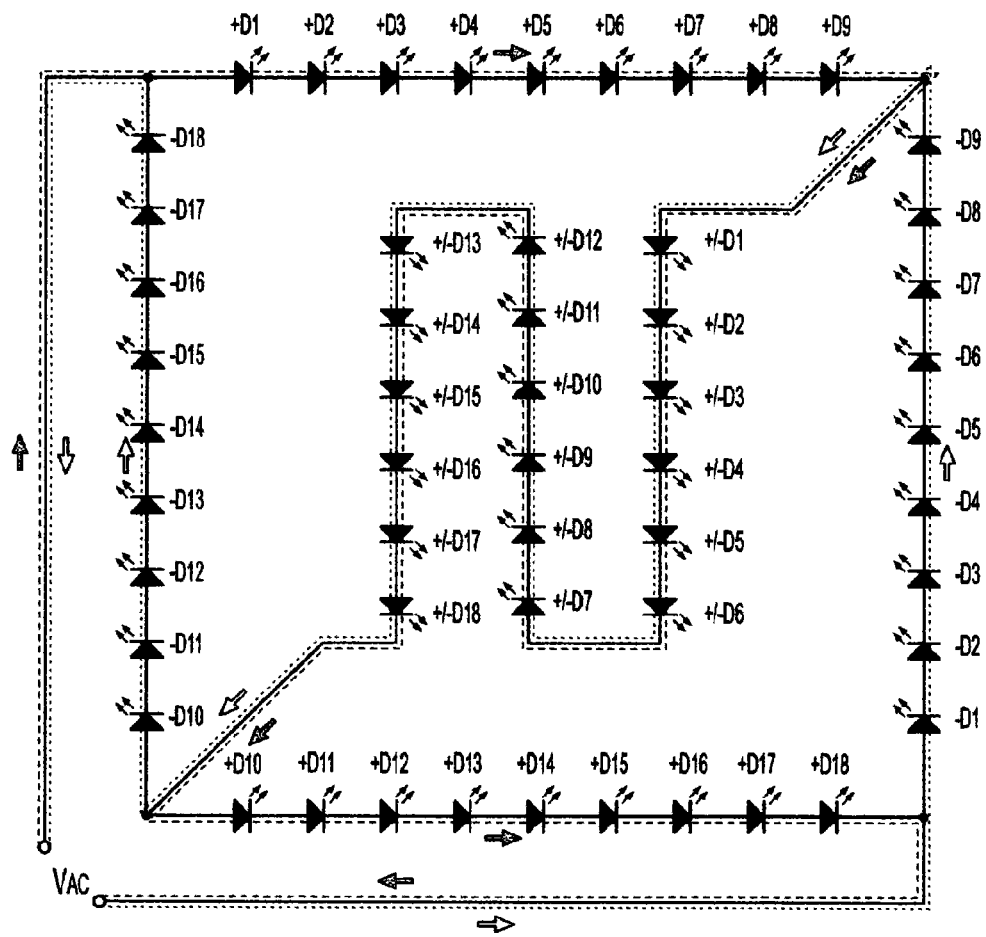
FIG. 1 depicts a schematic representation of an example AC LED circuit with LEDs configured as a full-wave rectifier and a string of LEDs configured to receive unidirectional current from the rectifier.

FIG. 1 depicts a schematic representation of an example AC LED circuit with LEDs configured as a full-wave rectifier and a string of LEDs configured to receive unidirectional current from the rectifier. The depicted AC LED is one example of a self-rectified LED circuit. As indicated by the arrows, the rectifier LEDs (depicted on the four sides) conduct current only in two out of four AC quadrants (Q1, Q2, Q3, Q4). Load LEDs (depicted diagonally within the rectifier) conduct current in all four quadrants. For example, in Q1 and Q2 when voltage is positive and rising or falling respectively, current is conducted through rectifier LEDs (+D1 to +Dn) and through load LEDs (±D1 to ±Dn). In Q3 and Q4 when voltage is negative and falling or rising respectively, current is conducted through rectifier LEDs (−D1 to −Dn) and through load LEDs (±D1 to ±Dn). In either case (e.g., Q1-Q2 or Q3-Q4), input voltage may have to reach a predetermined conduction angle voltage in order for LEDs to start conducting significant currents.

Figure 2:
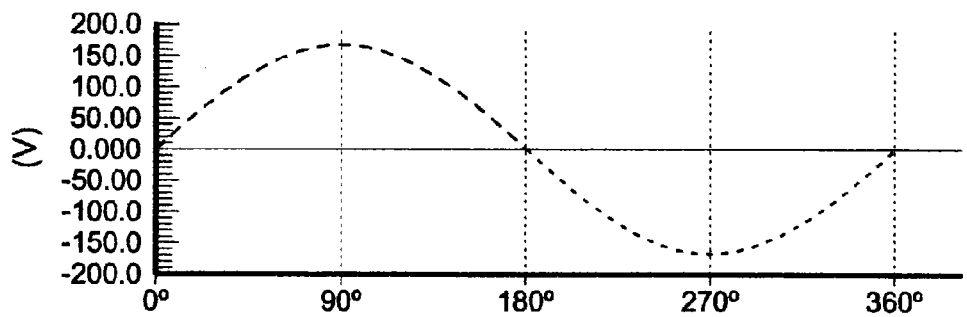
FIGS. 2-5 depict representative performance curves and waveforms of the AC LED circuit of FIG. 1.

FIG. 2 depicts a sinusoidal voltage, with one period of excitation spanning four quadrants. Q1 spans 0 to 90 degrees (electrical), Q2 spans 90 to 180 degrees (electrical), Q3 spans 180 to 270 degrees (electrical), and Q4 spans 270 to 360 (or 0) degrees (electrical).

Figure 3:
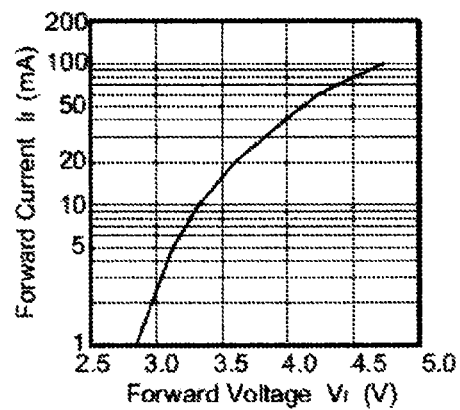

FIG. 3 depicts an exemplary characteristic curve for an LED. In this Figure, the current is depicted as substantially negligible below a threshold voltage of approximately 2.8 volts. Although representative, this particular characteristic is for one LED and may be different for other suitable LEDs, and therefore this specific Figure is not intended to be limiting. This characteristic may vary as a function of temperature.

Figure 4:
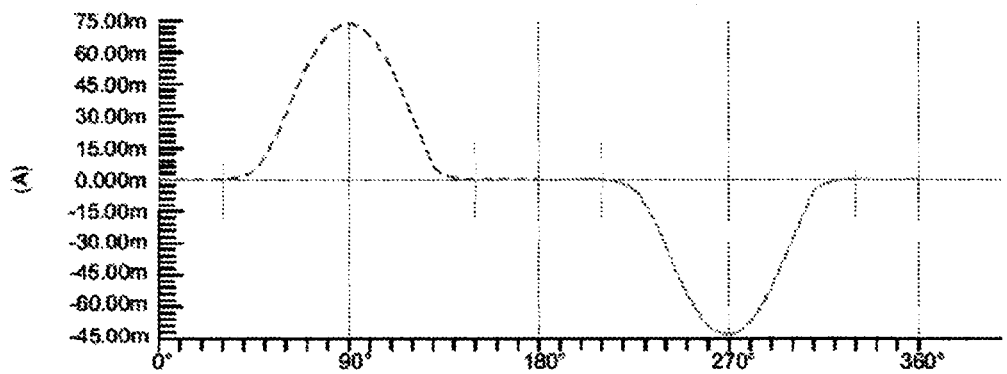

FIG. 4 depicts an illustrative current waveform for the sinusoidal voltage of FIG. 2 applied to the circuit of FIG. 1. For the positive half-cycle, the conduction angle begins at about 30 degrees, as shown, and extends to about 150 degrees electrical. For the negative half-cycle, the conduction angle extends from about 210 degrees (electrical) to about 330 degrees (electrical). Each half cycle is depicted as conducting current for about only 120 degrees.

Figure 5:
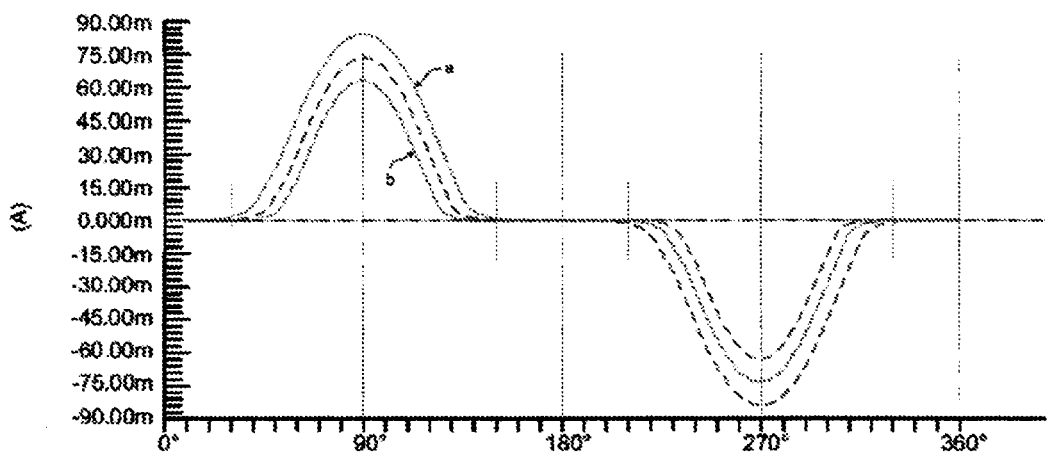

FIG. 5 depicts representative variations in the current waveform, for example, in different circuit configurations. For example, increased conduction angle (as indicated by curve "a") may be obtained by reducing the number of series LEDs, which may lead to excessive peak currents. In the depicted example, harmonic reduction (as indicated by curve "b") may be attempted by introducing extra series resistance, which may increase power dissipation and/or reduce light output.

Method and apparatus described next herein include selective current diversion circuitry, which may advantageously increase conduction angle of the AC LED, and/or improve power factor. Some implementations may further advantageously be arranged to substantially improve a balance of current loading among the load LEDs.

Figure 6:
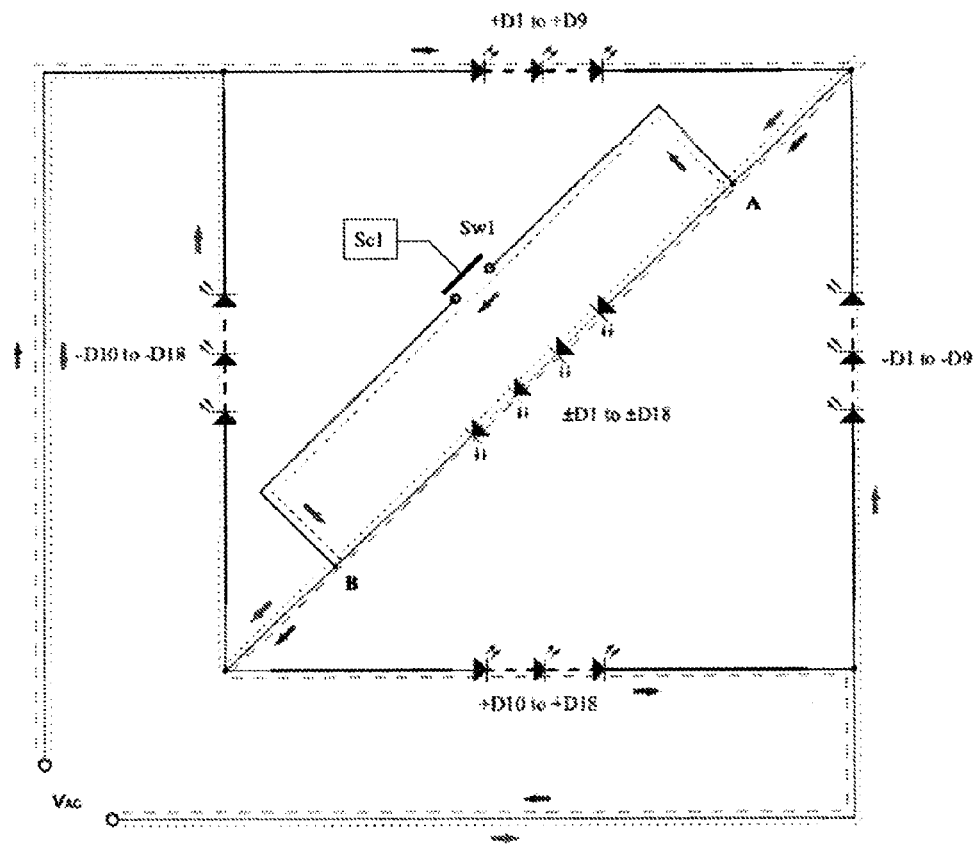
FIGS. 6-9 depict some exemplary embodiments of the full-wave rectifier lighting system with selective current diversion for improved power quality.

FIG. 6 depicts a first exemplary embodiment of the full-wave rectifier lighting system with selective current diversion for improved power factor capability. In this example, there is an additional bypass circuit added across a group of load LEDs connected in series between a node A and a node B. The bypass circuit includes a switch SW1 and a sensing circuit SC1. In operation, the bypass circuit is activated when the SW1 closes to divert current around at least some of the load LEDs. The switch SW1 is controlled by the sensing circuit SC1, which selects when to activate the bypass circuit.

In some embodiments, the SC1 operates by sensing input voltage. For example, when the sensed input voltage is below a threshold value, the bypass circuit may be activated to advance the conduction of current in Q1 or Q3, and then to maintain current conduction in Q2 or Q4.

In some embodiments, the SC1 may operate by sensing a current. For example, when the sensed LED current is below a threshold value, the bypass circuit is activated to advance the conduction of current in Q1 or Q3, and then to maintain current conduction in Q2 or Q4.

In some embodiments, the SC1 operates by sensing a voltage derived from the rectified voltage. For example, voltage sensing may be performed using a resistive divider. In some embodiments, a threshold voltage may be determined by a high value resistor coupled to drive current through an LED of an opto-coupler that controls the state of the SW1. In some embodiments, the SW1 may be controlled based on a predetermined time delay relative to a specified point in the voltage waveform (e.g., zero crossing or a voltage peak). In such cases the timing may be determined to minimize harmonic distortion of the current waveform supplied from the AC supply to the light apparatus.

In an illustrative example, the bypass switch SW1 may be arranged to activate primarily in response to a voltage signal that exceeds a threshold. The voltage sensing circuitry may be equipped to switch with a predetermined amount of hysteresis to control dithering near the predetermined threshold. To augment and/or provide a back-up control signal (e.g., in the event of a fault in the voltage sensing and control), some embodiments may further include auxiliary current and/or timing-based switching. For example, if the current exceeds some predetermined threshold value and/or the timing in the cycle is beyond a predetermined threshold, and no signal has yet been received from the voltage sensing circuit, then the bypass circuit may be activated to continue to achieve reduced harmonic distortion.

In an exemplary embodiment, the circuit SC1 may be configured to sense input voltage VAC. Output of the SC1 is high (true) when the input voltage is under a certain or predetermined value VSET. The switch SW1 is closed (conducting) if SC1 is high (true). Similarly, the output of the SC1 is low (false) when the voltage is over a certain or predetermined value VSET. The switch SW1 is open (non conducting) if SC1 is low (false). VSET is set to value representing total forward voltage of rectifier LED (+D1 to +Dn) at a set current.

In an illustrative example, once the voltage is applied to the AC LED at the beginning of a cycle that starts with Q1, output of the sensing circuit SC1 will be high and Switch SW1 will be activated (closed). Current is conducted only through rectifier LEDs (+D1 to +Dn) and via the bypass circuit path through the SW1. After input voltage increases to VSET, output of the sensing circuit SC1 goes low (false) and the switch SW1 will be transitioned to a deactivated (open) state. At this point, current transitions to be conducted through the rectifier LEDs (+D1 to +Dn) and the load LEDs (±D1 to ±Dn) until the SW1 in the bypass circuit is substantially non conducting. The sensing circuit SC1 functions similarly on both positive and negative half-cycles in that it may control an impedance state of the SW1 in response to an absolute value of VSET. Accordingly, substantially the same operation occurs in both half-cycles (e.g., Q1-Q2, or Q3-Q4) except load current will be flowing through rectifier LEDs (−D1 to −Dn) during the Q3-Q4.

Figure 7:
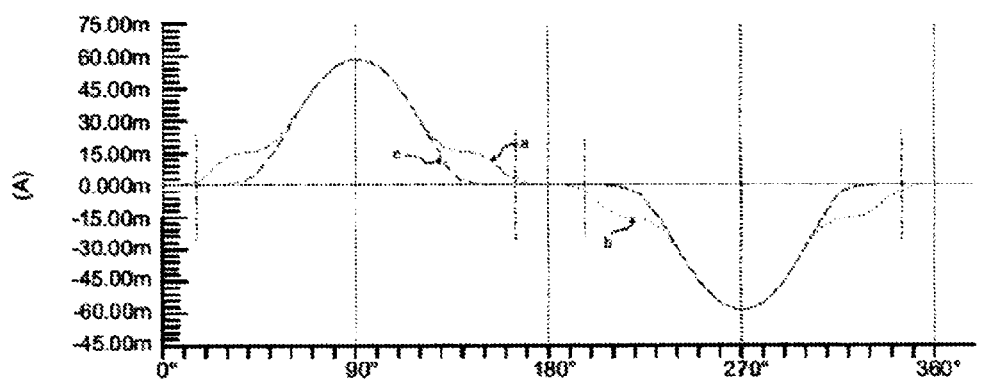

FIG. 7 depicts representative current waveforms with and without use of the bypass circuit path to perform selective current diversion for the circuit of FIG. 6. An exemplary characteristic waveform for the input current with the selective current diversion is shown in curves (a) and (b). A curve (c) represents an exemplary characteristic waveform for the input current with the selective current diversion disabled (e.g., high impedance in the bypass path). By bypassing load LEDs (±D1 to ±Dn), a conduction angle may be significantly increased. In the figure, a conduction angle for the waveform of curves (a,b) is shown as extending from about 10-15 degrees (electrical) to about 165-170 degrees (electrical) in Q1, Q2 and about 190-195 degrees (electrical) to about 345-350 degrees (electrical) in Q3, Q4, respectively.

In another illustrative embodiment, the SC1 may operate in response to a sensed current. In this embodiment, the SC1 may sense current flowing through the rectifier LEDs (+D1 to +Dn) or (−D1 to −Dn), respectively. Output of the SC1 is high (true) when the forward current is under a certain preset or predetermined value ISET. The switch SW1 is closed (conducting) if SC1 is high (true). Similarly, the output of the SC1 is low (false) when the forward current is over a certain or predetermined value ISET. The switch SW1 is open (non conducting) if SC1 is low (false). ISET may be set to a value, for example, representing current at a nominal forward voltage of rectifier LEDs (+D1 to +Dn).

Operation of the exemplary apparatus will now be described. Once the voltage is applied to the AC LED, output of the sensing circuit SC1 will be high and the switch SW1 will be activated (closed). Current is conducted only through rectifier LEDs (+D1 to +Dn) and via the bypass circuit path through the SW1. After forward current increases to a threshold current ISET, output of the sensing circuit SC1 goes low (false) and the switch SW1 will transition to a deactivated (open) state. At this point, current transitions to be conducted through the rectifier LEDs (+D1 to +Dn) and the load LEDs (±D1 to ±Dn), as the bypass circuit transitions to a high impedance state. Similarly, when input voltage is negative, current will be flowing through the rectifier LEDs (−D1 to −Dn). By introducing selective current diversion to selectively bypass the load LEDs (±D1 to ±Dn), a conduction angle may be significantly improved.

Figure 8:
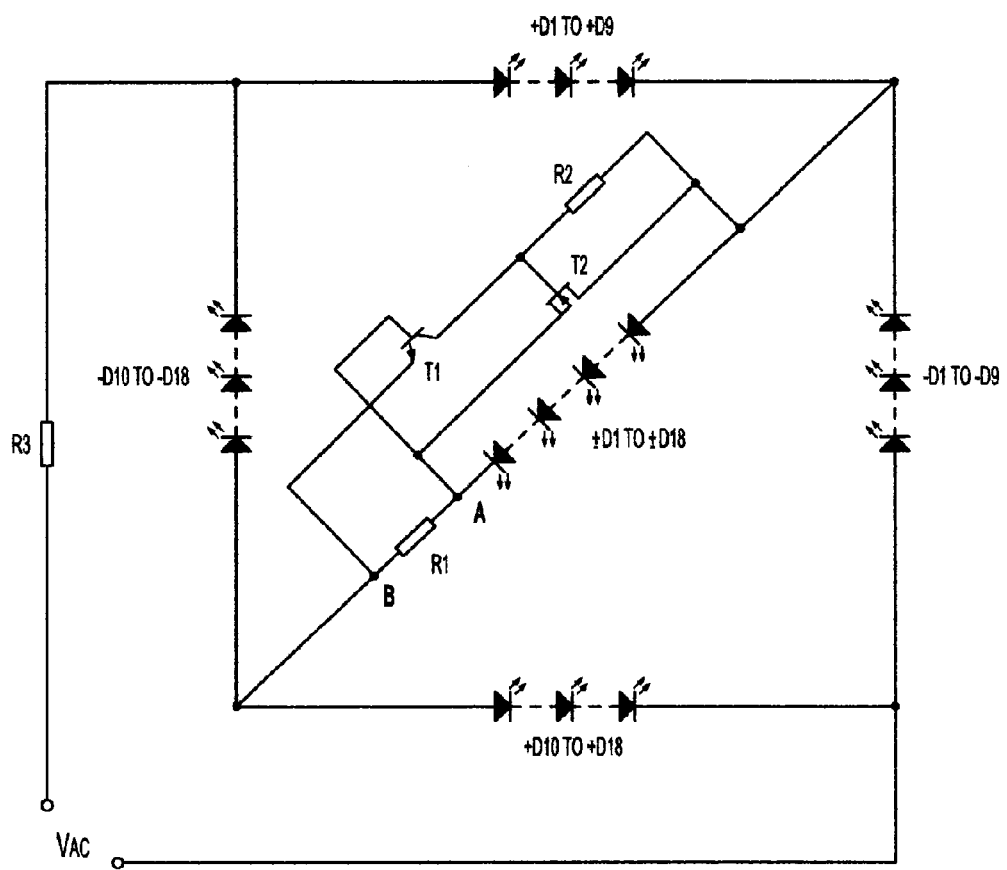

FIG. 8 shows an exemplary embodiment that operates the bypass circuit in response to a bypass circuit responsive to an input current supplied by the excitation source (VAC) through a series resistor R3. A resistor R1 is introduced at a first node in series with the load LED string (±D1 to ±D18). R1 is connected in parallel with a base and emitter of a bipolar junction transistor (BJT) T1, the collector of which is connected to a gate of an N-channel field effect transistor (FET) T2 and a pull-up resistor R2. The resistor R2 is connected at its opposite end to a second node on the LED string. The drain and source of the transistor T2 are coupled to the first and second nodes of the LED string, respectively. In this embodiment, the sensing circuit is self-biased and there is no need for an external power supply.

In one exemplary implementation, the resistor R1 may be set to a value where voltage drop across R1 reaches approximately 0.7V at a predetermined current threshold, ISET. For example, if ISET is 15 mA, an approximate value for the R1 may be estimated from R=V/I=0.7V/0.015 A≈46Ω. Once voltage is applied to the AC LED, a gate of the transistor T2 may become forward biased and fed through resistor R2, which value may be set to several hundred kΩ. Switch T1 will be fully closed (activated) after input voltage reaches approximately 3V. Now current flows through rectifier LEDs (+D1 to +Dn), switch T2 and Resistor R1 (bypass circuit). Once forward current reaches approximately ISET, the transistor T1 will tend to reduce a gate-source voltage for the transistor T2, which will tend to raise an impedance of the bypass path. At this condition, the current will transition from the transistor T2 to the load LEDs (±D1 to ±Dn) as the input current amplitude increases. A similar situation will repeat in a negative half-cycle, except current will flow through rectifier LEDs (−D1 to −Dn) instead.

As described with respect to various embodiments, load balancing may advantageously reduce the asymmetric duty cycles or substantially equalize duty cycles as between the rectifier LEDs and the load LEDs (e.g., those that carry the unidirectional current in all four quadrants). In some examples, such load balancing may further advantageously substantially reduce flickering effect which is generally lower at LEDs with higher duty cycle.

Bypass circuit embodiments may include more than one bypass circuit. For example, further improvement of the power factor may be achieved when two or more bypass circuits are used to bypass selected LEDs.

Figure 9:
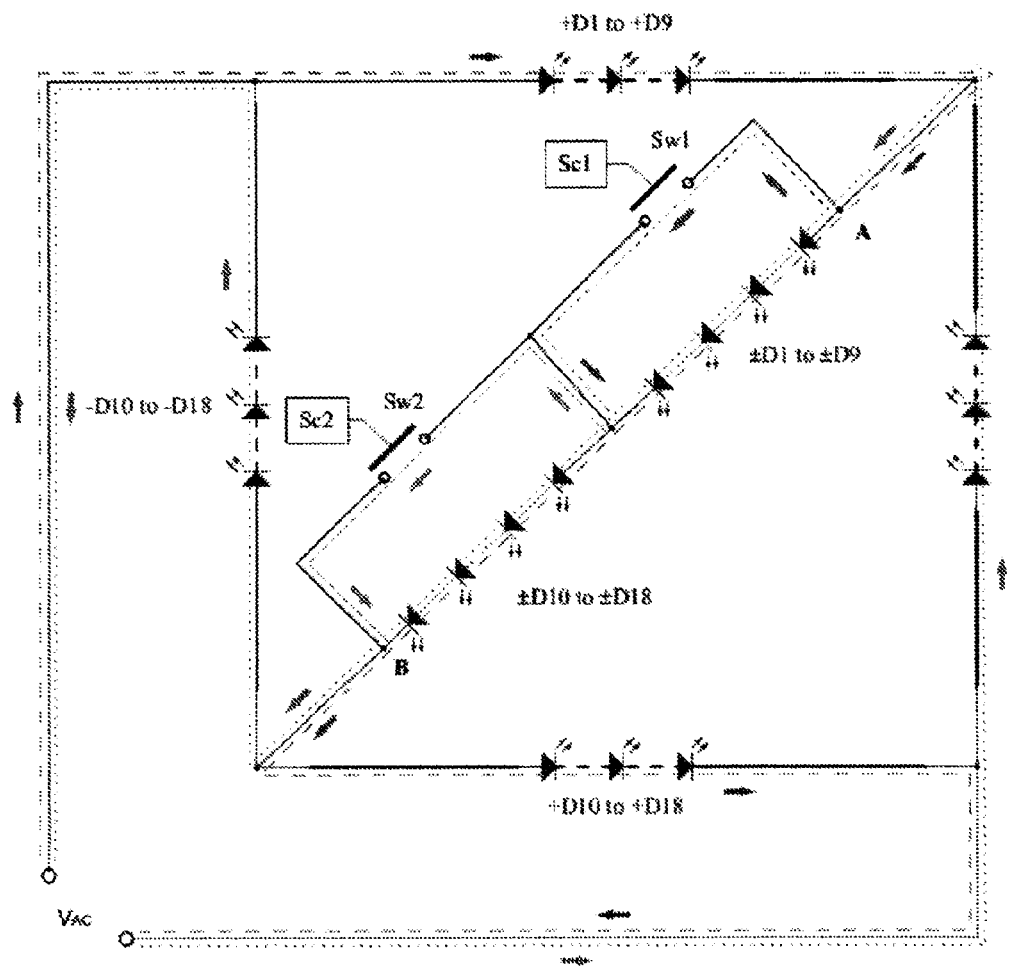

FIG. 9 shows two bypass circuits. SC1 and SC2 may have different thresholds and may be effective in further improving the input current waveform so as to achieve even higher conduction angles.

The number of bypass circuits for an individual AC LED circuit may, for example, be 1, 2, 3, 4, 5, 6, 7, 8, 9, 10, 11, 12, 13, 14, or more, such as 15, about 18, 20, 22, 24, 26, 28, or at least 30, but may include as many permutations as practicable to improve power quality. A bypass circuit may be configured to divert current away from a single LED, or any number of series-, parallel- or series/parallel-connected LEDs as a group, in response to circuit conditions.

Figure 10:
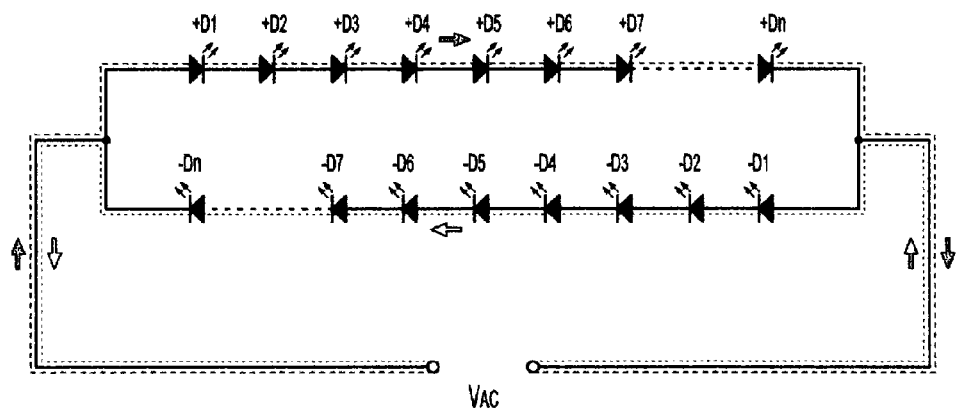
FIGS. 10-11 depict AC LED strings configured for half-wave rectification without selective current diversion.

Bypass circuits may be applied to LEDs in the load LEDs, as shown in the example embodiments in FIGS. 6, 8 and 10. In some implementations, one or more bypass circuits may be applied to selectively divert current around one or more LEDs in the full-wave rectifier stage.

As we can see from example in FIG. 8, self-biasing bypass circuit can be implemented with a few discrete components. In some implementations, a bypass circuit may be manufactured on a single die with the LEDs. In some embodiments, the bypass circuit may be implemented in whole or in part using discrete components, and/or integrated with one or more LEDs associated with a group of bypassed LEDs or the entire AC LED circuit.

FIG. 10 depicts an example AC LED lighting apparatus that includes two strings of LEDs configured as a half-wave rectifier in which each LED string conducts and illuminates on alternating half cycles. In particular, a positive group (+D1 to +Dn) conducts current in Q1 and Q2 and a negative group (−D1 to −Dn) conducts current in Q3 and Q4. In either case (Q1-Q2 or Q3-Q4), the AC input voltage may have to reach a threshold excitation voltage corresponding to a corresponding conduction angle in order for LEDs to start conducting significant currents, as discussed with reference to FIG. 4.

Figure 11:
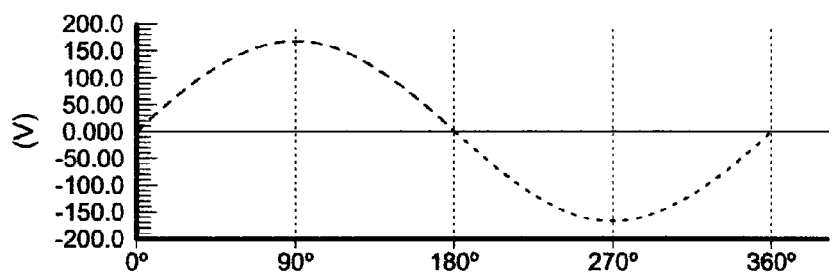

FIG. 11 depicts a typical sinusoidal excitation voltage Vac waveform for exciting the AC LED lighting apparatus of FIG. 10. This waveform is substantially similar to that described with reference to FIG. 2.

Some of the exemplary methods and apparatus described herein may significantly improve a conduction angle of the AC LED with at least one polarity of a periodically alternating polarity (e.g., sinusoidal AC, triangular wave, square wave) excitation voltage. In some implementations, the excitation voltage may be modified by leading and/or trailing phase modulation, pulse width modulation, for example. Some examples may achieve advantageous performance improvements with substantially balanced current to the load LEDs.

Figure 12:
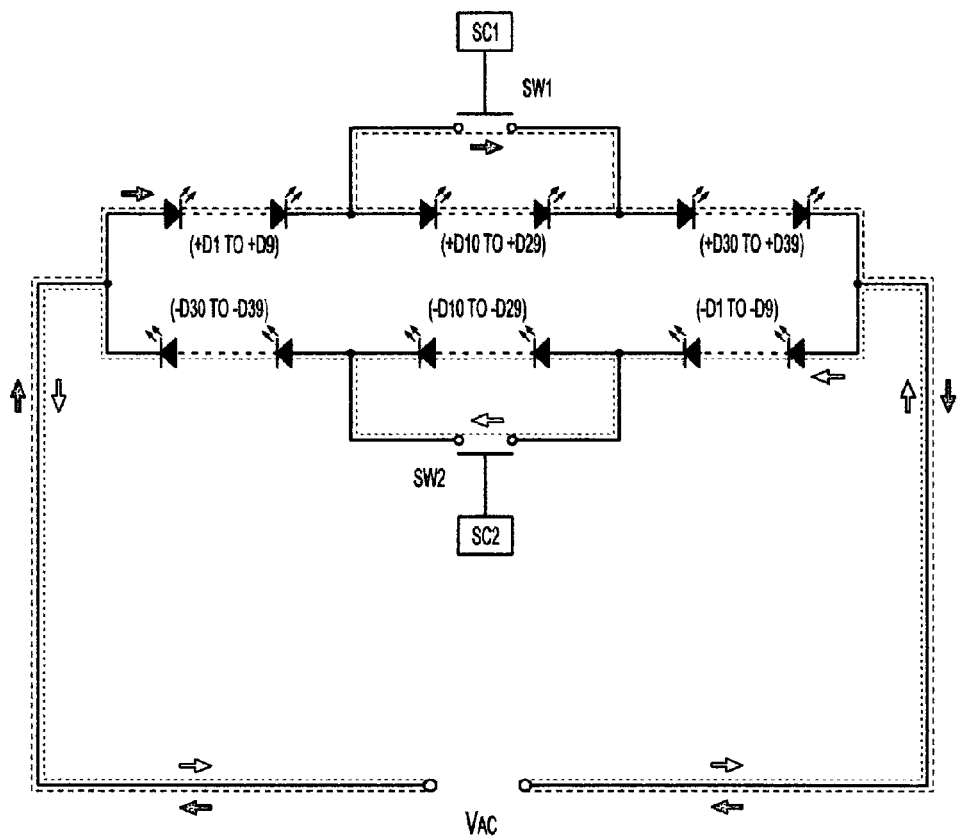
FIGS. 12-13 depict an example circuit with AC LED strings configured for half-wave rectification with selective current diversion.

As shown in FIG. 12, the circuit of FIG. 10 is modified to include two bypass circuits added across at least some of the load LEDs. A first bypass circuit includes a switch SW1 controlled by a sensing circuit SC1. A second bypass circuit includes a switch SW2 controlled by a sensing circuit SC2. Each bypass circuit provides a bypass path which may be activated and deactivated by switch SW1 or SW2, respectively.

In an illustrative example, an exemplary light engine may include 39 LEDs in series for conduction during respective positive and negative half-cycles. It should be understood that any suitable combination of the LEDs in serial and parallel can be used. In various implementations, the number and arrangement of LEDs selected may be a function of the light output, current, and voltage specifications, for example. In some regions the rms (root mean square) line voltage may be about 100V, 120, 200, 220, or 240 Volts.

In a first illustrative embodiment, the bypass switches are activated in response to input voltage. The SC1 may sense input voltage. Output of the SC1 is high (true) when the voltage is under a certain or predetermined value VSET. The SW1 is closed (conducting) if SC1 is high (true). Similarly, the output of the SC1 is low (false) when the voltage is over a certain value or a predetermined threshold VSET. The switch SW1 is open (non conducting) if SC1 is low (false). VSET is set, for example, to a value representing total forward voltage, at a set current, of all LEDs outside of the LEDs bypassed by the bypass circuit.

The operation of the apparatus will now be described. Once the voltage is applied to the AC LED, output of the sensing circuit SC1 will be high and Switch SW1 will be activated (closed). Current is conducted only through (+D1 to +D9) and (+D30 to +D39) and via the first bypass circuit. After input voltage increases to VSET, output of the sensing circuit SC1 goes low (false) and Switch SW1 will be deactivated (open). At that point, current is transitioned to be conducted through all LEDs (+D1 to +D39), and the first bypass circuit is transitioned to a high impedance (e.g., substantially non-conducting) state.

The same process will repeat when input voltage is negative except load will be flowing through the negative LED group (−D1 to −D30) substantially as described with reference to the positive LED group. The sensing circuit SC2 and switch SW2 may be activated or deactivated accordingly as the input voltage reach a negative value of VSET.

Figure 13:
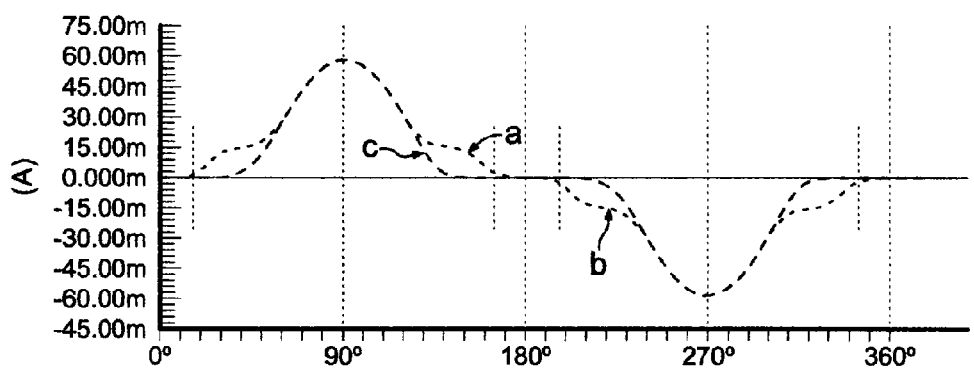

FIG. 13 depicts representative current waveforms with and without use of the bypass circuit path to perform selective current diversion for the circuit of FIG. 12. An exemplary characteristic waveform for the input current with the selective current diversion is shown in curves (a) and (b). A curve (c) represents an exemplary characteristic waveform for the input current with the selective current diversion disabled (e.g., high impedance in the bypass paths). The selective current diversion technology of this example may significantly increase a conduction angle, substantially as described with reference to FIG. 7. By bypassing LEDs (+D10 to +D29) and (−D10 to −D29) respectively, conduction angle may be significantly improved.

In a second illustrative embodiment, the bypass switches SW1, SW2 may be activated in response to input voltage sense signals. The SC1, SC2 senses current flowing through LEDs (+D1 to +D9) and (+D30 to +D39) respectively. Output of the SC1 is high (true) when the forward current is under a certain value or predetermined threshold ISET. The switch SW1 is closed (conducting) if SC1 is high (true). Similarly, the output of the SC1 is low (false) when the forward current exceeds ISET. The switch SW1 may transition to an open (non conducting) state while SC1 is low (false). ISET may, for example, be set to a value approximately representing current at nominal forward voltage of sum of LED (+D1 to +D9) and (+D30 to +D39).

The operation of an exemplary apparatus will now be described. Once the voltage is applied to the AC LED, output of the sensing circuit SC1 will be high and the switch SW1 will be activated (closed). Current is conducted only through LEDs (+D1 to +D9) and (+D30 to +D39) and via the bypass circuit. After forward current increases to ISET, output of the sensing circuit SC1 goes low (false) and the switch SW1 will be deactivated (open). At this point, a current may transition to being conducted through LEDs (+D1 to +D39) and the SW1 in the first bypass circuit is substantially non-conducting. Similarly, when input voltage declines and current falls substantially below ISET, then the switch SW1 will be activated and at least a portion of the current may be diverted to flow through the bypass switch SW1 rather than the LEDs (+D10 to +D29).

A substantially similar process will occur when the input voltage is negative, except load current will be flowing through the negative group of LEDs and/or the second bypass circuit.

In some embodiments, load balancing may advantageously reduce flickering effect, if any. Where applicable, flickering effects may be generally reduced by increasing duty cycle and/or conduction angle for the LEDs.

Bypass circuitry operable to condition current using selective current diversion technology is not limited to embodiments with only one bypass circuit. For further improvement of the power factor, some examples may include an increased number of the bypass circuits and arrange the LEDs into a number of subgroups. Exemplary embodiments with more than one bypass circuit are described with reference at least to FIG. 9, 12, 20, 39, or 42-43, for example.

In some implementations, some bypass circuit embodiments, such as the exemplary bypass circuitry of FIG. 8, can be manufactured on a single die with one or more LEDs in an AC LED light engine.

Figure 14:
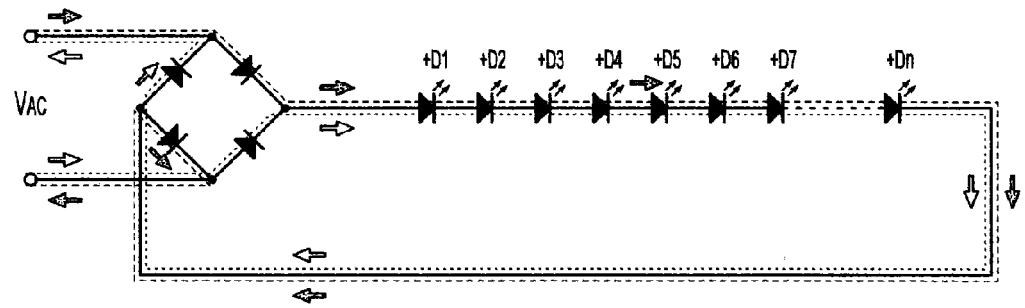
FIGS. 14-16 disclose an AC LED topology using conventional (e.g., non-LED) rectifiers.

FIG. 14 depicts an exemplary AC LED topology which includes a conventional diode rectifier feeding a string of LEDs. This exemplary topology includes a full bridge rectifier and load LEDs (+D1 to +D39) as shown in FIG. 14.

Figure 15:
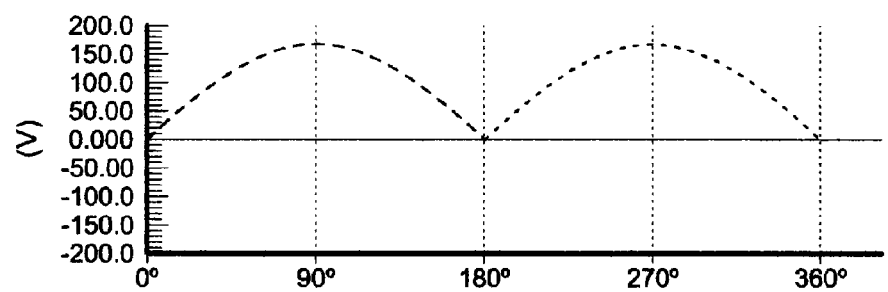

FIG. 15 shows a sinusoidal voltage after being processed by a full bridge rectifier. Voltage across LEDs (+D1 to +D39) is substantially always uni-directional (e.g., positive) in polarity.

Figure 16:
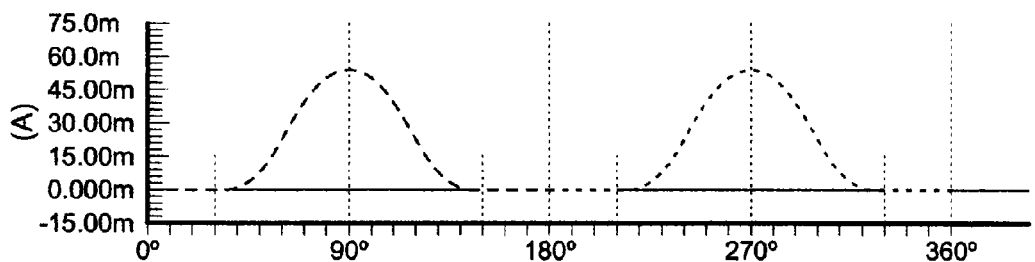

FIG. 16 illustrates a current waveform that illustrates operation of the AC LED circuit of FIG. 14. In particular, the input voltage has to reach a predetermined conduction angle voltage in order for LEDs to start conducting higher currents. This waveform is substantially similar to that described with reference to FIG. 4.

Figure 17:
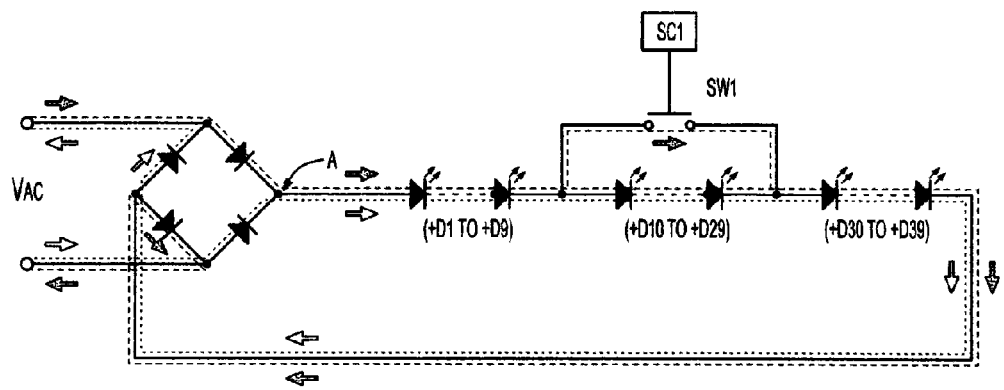
FIGS. 17-19 disclose exemplary embodiments that illustrate selective current diversion applied to the AC LED topology of FIG. 14.
Figure 18:
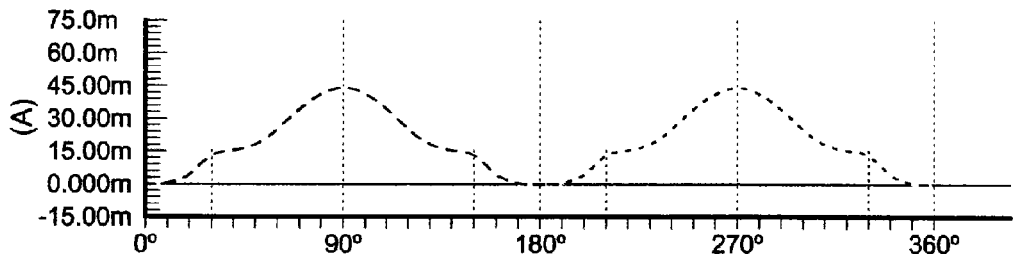
Figure 19:
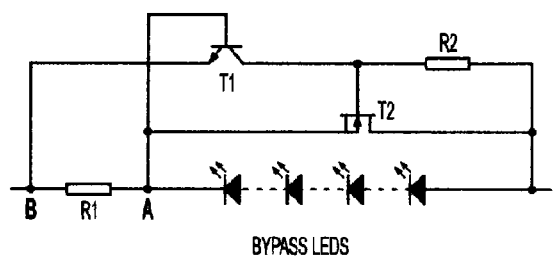

FIGS. 17-19 disclose exemplary embodiments that illustrate selective current diversion applied to the AC LED topology of FIG. 14.

FIG. 17 shows a schematic of the AC LED topology of FIG. 14 that further includes a bypass circuit applied to a portion of the LEDs in the load.

Method and apparatus described herein may significantly improve a conduction angle of an AC LED. As shown in FIG. 17, there is an additional exemplary bypass circuit added across the load LEDs. The bypass circuit is activated and deactivated by the switch (SW1). The switch SW1 is controlled by the sensing circuit SC1.

In a first illustrative embodiment, the SC1 controls the bypass switch in response to input voltage. SC1 may sense input voltage at a node A (see FIG. 17). Output of the SC1 is high (true) when the voltage is under a certain or predetermined value VSET. The switch SW1 is closed (conducting) if SC1 is high (true). Similarly, the output of the SC1 is low (false) when the voltage is over a certain or predetermined value VSET. The switch SW1 is open (non conducting) if SC1 is low (false). In one example, VSET is set to a value approximately representing total forward voltage sum of LEDs (+D1 to +D9) and (+D30 to +D39) at a set current.

Once the voltage is applied to the AC LED, output of the sensing circuit SC1 will be high and Switch SW1 will be activated (closed). Current is conducted only through LEDs (+D1 to +D9) and (+D30 to +D39) and via the bypass circuit. After input voltage increases to VSET, output of the sensing circuit SC1 goes low (false) and Switch SW1 will be transitioned to a deactivated (open) state. At this condition, current may be transferred to be conducted through LEDs (+D1 to +D9) and (+D9 to +D29) and (+D30 to +D39). The bypass circuit may transition to be substantially non conducting. Similarly, when input voltage declines in Q2 or Q4 under VSET, switch SW1 will be activated and current flow will bypass LEDs (+D10 to +D29).

FIG. 18 shows exemplary effects on the input current. By bypassing group of LEDs (+D11 to +D29), conduction angle may be significantly improved.

In a second illustrative embodiment, the SC1 controls the bypass switch in response to current sense. SC1 is sensing current flowing through LED (+D1 to +D9) and (+D30 to +D39) respectively. Output of the SC1 is high (true) when the forward current is under certain or predetermined value ISET. Switch SW1 is closed (conducting) if SC1 is high (true). The output of the SC1 is low (false) when the forward current is over certain or predetermined value ISET. Switch SW1 is open (non conducting) if SC1 is low (false). ISET is set to a value representing current at a nominal forward voltage of sum of the LEDs (+D1 to +D9) and (+D30 to +D39).

Once the voltage is applied to the AC LED, output of the sensing circuit SC1 will be high and Switch SW1 will be activated (closed). Current is conducted only through LEDs (+D1 to +D9) and (+D30 to +D39) and via bypass circuit. After forward current increases to ISET, output of the sensing circuit SC1 goes low (false) and Switch SW1 will be deactivated (open). Current is now conducted through LEDs (+D1 to +D9) and (+D30 to +D39) and LEDs (+D10 to +D29). Bypass circuit is non conducting. Similarly, when current drops under ISET in Q2 or Q4, switch SW1 will be activated and current flow will bypass LEDs (+D10 to +D29).

Various embodiments may advantageously provide, for a full-wave rectified AC LED light engine, a reduction in flickering effect which may be generally lower for LEDs operated with higher duty cycle.

Some embodiments may include more than one bypass circuit arranged to divert current around a group of LEDs. For further improvement of the power factor, for example, two or more bypass circuits may be employed. In some examples, two or more bypass circuits may be arranged to divide a group of bypass LEDs into subgroups. In some other examples, a light engine embodiment may include at least two bypass circuits arranged to selectively divert current around two separate groups of LEDs (see, e.g., FIGS. 9, 26). FIG. 12 shows an example light engine that includes two bypass circuits. Further embodiments of light engine circuits with more than one bypass path are described at least with reference to FIGS. 42-43, for example.

FIG. 19 shows an exemplary implementation of a bypass circuit for an LED light engine. A bypass circuit 1900 for selectively bypassing a group of LEDs includes a transistor T2 (e.g., n-channel MOSFET) connected in parallel with the LEDs to be bypassed. A gate of the transistor T2 is controlled by a pull-up resistor R2 and a bipolar junction transistor T1. The transistor T1 is responsive to a voltage across the sense resistor R1, which carries the sum of the instantaneous currents through the transistor T2 and the LEDs. As instantaneous circuit voltage and current conditions applied to the bypass circuit vary in a smooth and continuous manner, the input current division between the transistor T2 and the LEDs will vary in a corresponding smooth and continuous manner, as will be described in further detail with reference, for example, to FIG. 32.

Various embodiments may operate light engine by modulating impedance of the transistor T2 at an integral (e.g., 1, 2, 3) multiple of line frequency (e.g., about 50 or 60 Hz). The impedance modulation may involve operating the transistor T2 in the bypass path in a linear (e.g., continuous or analog) manner by exercising its saturated, linear, and cut-off regions, for example, over corresponding ranges of circuit conditions (e.g., voltage, current).

In some examples, the operating mode of the transistor may be a function of the level of instantaneous input current. Examples of such function will be described with reference to at least FIG. 22, 27 or 32, for example.

Figure 20:
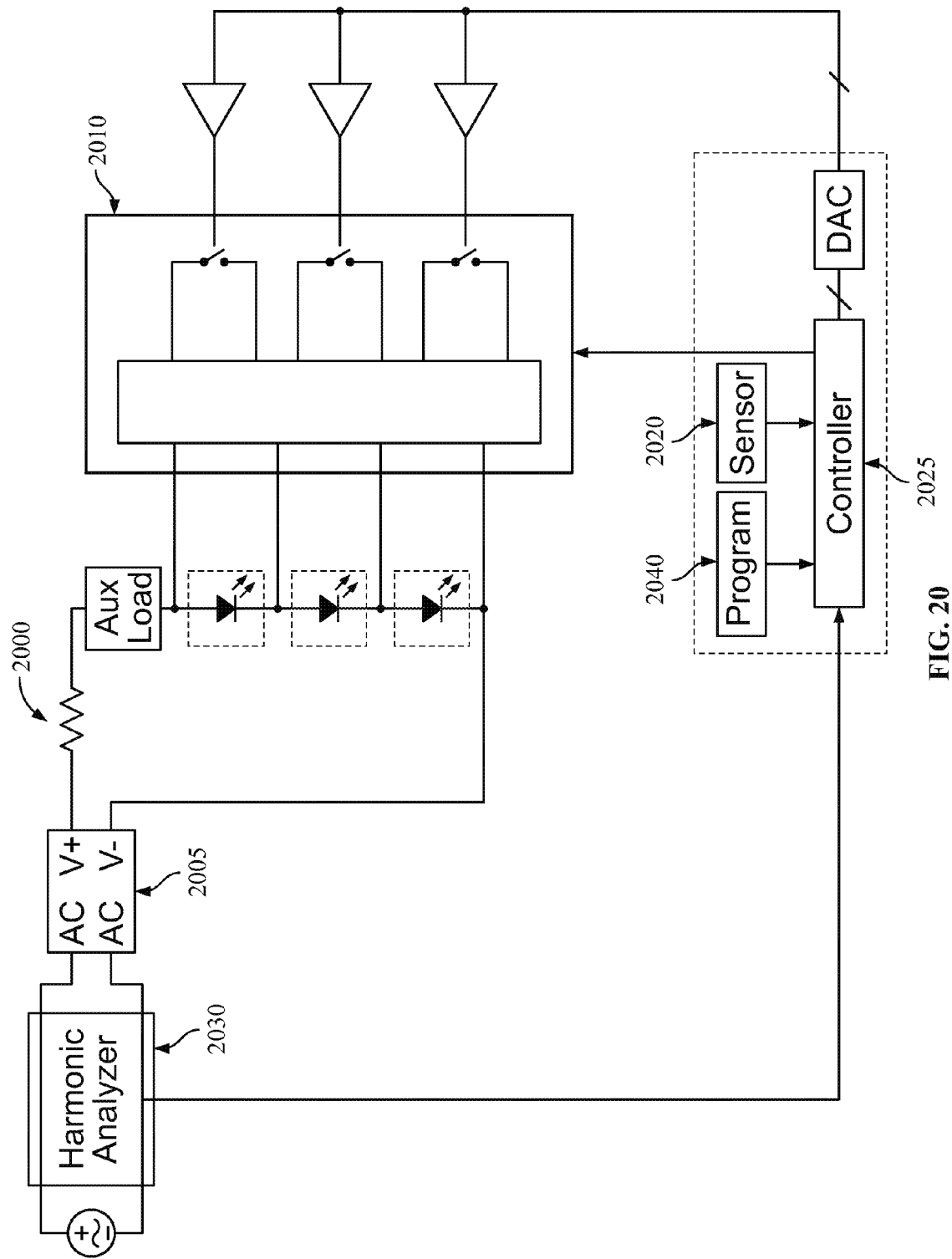
FIG. 20 shows a block diagram of an exemplary apparatus for calibrating or testing power factor improvements in embodiments of the lighting apparatus.

FIG. 20 shows a block diagram of an exemplary apparatus for calibrating or testing power factor improvements in embodiments of the lighting apparatus. The apparatus provides capabilities to test the harmonic content of the current, measure power factor for a large number of configurations of bypass switches at independently controlled voltage or current thresholds. In this manner, an automated test procedure, for example, may be able to rapidly determine an optimal configuration for one or more bypass switches for any lighting apparatus. The resulting optimal configuration may be stored in a database, and/or downloaded to a data store device associated with the lighting apparatus under test.

The depicted apparatus 2000 includes a rectifier 2005 (which may include LEDs, diodes, or both) in series with a load that includes an auxiliary module of components and a string of LEDs for illumination. The apparatus further includes an analog switch matrix 2010 that can connect any node in the diode string to the terminals of any of a number of bypass switches. In some examples, a test pin fixture may be used to make contact with the nodes of the lighting apparatus under test. The apparatus further includes a light sensor 2020, which may be configured to monitor the intensity and/or color temperature output by the lighting apparatus. The apparatus further includes a controller 2025 that receives power factor (e.g., harmonic distortion) data from a power analyzer 2030, and information from the light sensor 2020, and is programmed to generate control commands to configure the bypass switches.

In operation, the controller sends a command to connect selected nodes of the lighting apparatus to one or more of the bypass switches. In a test environment, the bypass switches may be implemented as relays, reed switches, IGBTs, or other controllable switch element. The analog switch matrix 2010 provides for flexible connections from available nodes of the LED string to a number of available bypass switches. The controller also sets the threshold conditions at which each of the bypass switches may open or close.

The controller 2025 may access a program 2040 of executable instructions that, when executed, cause the controller to operate a number of bypass switches to provide a number of combinations of bypass switch arrangements. In some embodiments, the controller 2025 may execute the program of instructions to receive a predetermined threshold voltage level in association with any or all of the bypass switches.

For example, the controller 2025 may operate to cause a selected one of the bypass switches to transition between a low impedance state and a dynamic impedance state. In some examples, the controller 2025 may cause a transition when an applied excitation voltage crosses a predetermined threshold voltage. In some examples, the controller 2025 may cause a transition when an input current crosses a predetermined threshold current, and/or satisfies one or more time-based conditions.

By empirical assessment of the circuit performance under various parameter ranges, some implementations may be able to identify configurations that will meet a set of prescribed specifications. By way of example and not limitation, specifications may include power factor, total harmonic distortion, efficiency, light intensity and/or color temperature.

For each configuration that meets the specified criteria, one or more cost values may be determined (e.g., based on component cost, manufactured cost). As an illustrative example, a lowest cost or optimal output configuration may be identified in a configuration that includes two bypass paths, a set of LEDs to be bypassed by each bypass circuit, and two bypass circuits. Each path may be characterized with a specified impedance characteristic in each bypass circuit.

Experimental results are described with reference to FIGS. 21-37. Experimental measurements were collected for a number of illustrative embodiments that included selective current diversion to condition current for an LED light engine. In each measurement, the applied excitation voltage was set to a 60 Hz sinusoidal voltage source at 120 Vrms (unless otherwise indicated) using an Agilent 6812B AC Power Source/Analyzer. Waveform plots and calculated power quality parameters for the input excitation voltage and current were captured using a Tektronix DP03014 Digital Phospor oscilloscope with a DP03PWR module. The experimental excitation voltage amplitude, waveform, and frequency, are exemplary, and not to be understood as necessarily limiting.

Figure 21:
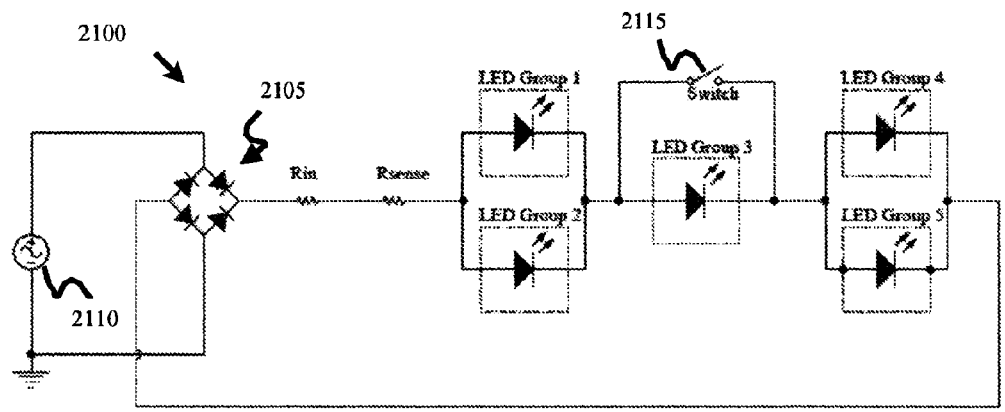
FIG. 21 shows a schematic of an exemplary circuit for an LED light engine with improved harmonic factor and/or power factor performance.

FIG. 21 shows a schematic of an exemplary circuit for an LED light engine with improved harmonic factor and/or power factor performance. In the depicted example, a light engine circuit 2100 includes a full wave rectifier 2105 that receives electrical excitation from a periodic voltage source 2110. The rectifier 2105 supplies substantially unidirectional output current to a load circuit. The load circuit includes a current limiting resistor Rin, a current sense resistor Rsense, a bypass switch 2115 connected to a network of five LED groups (LED Group 1-LED Group 5).

LED Group 1 and LED Group 2 are two LED networks connected in a first parallel network. Similarly, LED Group 4 and LED Group 5 are two LED networks connected in a second parallel network. LED Group 3 is an LED network connected in series with and between the first and second parallel networks. The bypass switch 2115 is connected in parallel with the LED Group 3. A control circuit to operate the bypass switch is not shown, but suitable embodiments will be described in further detail, for example, with reference at least to FIG. 6-8, 19, or 26-27.

In operation, the bypass switch 2115 is in a low impedance state at the beginning and end of each period while the AC input excitation current is below a predetermined threshold. While the bypass switch 2115 is in the low impedance state, the input current that flows through the LED Groups 1, 2 is diverted along a path through the bypass switch 2115 that is in parallel to the third group of LEDs. Accordingly, light emitted by the light engine 2100 while the AC input excitation 2110 is below the predetermined threshold is substantially only provided by the LED Groups 1, 2, 4, 5. Engaging the bypass switch 2115 to divert current around the LED Group 3 at low excitation levels may effectively lower the forward threshold voltage needed to begin drawing input current. Accordingly, this substantially increases the conduction angle relative to the same circuit without the bypass switch 2115.

The bypass switch may exhibit a substantially linearly transition to a high impedance state as the AC input excitation current rises above the predetermined threshold (e.g., the forward threshold voltage of LED Group 3). As the bypass switch 2115 transitions into the high impedance state, the input current that flows through the first and second groups of LEDs also begins to transition from flowing through the bypass switch 2115 to flowing through the LED Group 3. Accordingly, light emitted by the light engine while the AC input excitation is above the predetermined threshold is substantially a combination of light provided by the LED Groups 1-5.

In an illustrative example for 120 Vrms applications, the LED Groups 1, 2, 4, 5 may each include about 16 LEDs in series. The LED Group 3 may include about 23 LEDs in series. The LED Groups 1, 2, 4, 5 may include LEDs that emit a first color output, and the LED Group 3 may include LEDs that emit at least a second color output when driven by a substantial current. In various examples, the number, color, and/or type of LED may be different in and among the various groups of LEDs.

By way of an illustrative example and not limitation, the first color may be substantially a warm color (e.g., blue or green) with a color temperature of about 2700-3000 K. The second color may be substantially a cool color (e.g., white) with a color temperature of about 5000-6000 K. Some embodiments may advantageously smoothly transition an exemplary light fixture having an output color from a cool (second) color to a warm (first) color as the AC excitation supplied to the light engine is reduced, for example, by lowering a position of the user input element on the dimmer control. Examples of circuits for providing a color shift are described, for example, with reference to FIGS. 20A-20C in U.S. Provisional Patent Application Ser. No. 61/234,094, entitled "Color Temperature Shift Control for Dimmable AC LED Lighting," filed by Grajcar on Aug. 14, 2009, the entire contents of which are incorporated by reference.

In one example, the LED Groups 1, 2, 4, 5 may each include about eight, nine, or ten LEDs in series, and the LED Group 3 may include about 23, 22, 21, or 20 LEDs, respectively. Various embodiments may be arranged with the appropriate resistance and number of series connected diodes to provide, for example, a desired output illumination using an acceptable peak current (e.g., at a peak AC input voltage excitation).

The LEDs in the LED Groups 1-3 may be implemented as a package or in a single module, or arranged as individual and/or groups of multiple-LED packages. The individual LEDs may output all the same color spectrum in some examples. In other examples, one or more of the LEDs may output substantially different colors than the remaining LEDs.

In some embodiments, a parallel arrangement of the LED groups 1, 2, 4, 5 may advantageously substantially reduce an imbalance with respect to aging of the LED Group 3 relative to aging of the LED Groups 1, 2, 4, 5. Such an imbalance may arise, for example, where the conduction angle of current through the bypassed LEDs may be substantially less than the conduction angle of current through the first and second groups of LEDs. The LED Groups 1, 2, 4, 5 conduct current substantially whenever AC excitation input current is flowing. In contrast, the LED Group 3 only conducts forward current when the bypass switch 2115 is not diverting at least a portion of the input current through a path that is in parallel with the LED Group 3.

The rectifier bridge 2105 is depicted as a full bridge to rectify single phase AC excitation supplied from the voltage source 2110. In this configuration, the rectifier bridge 2105 rectifies both the positive and negative half-cycles of the AC input excitation to produce unidirectional voltage waveform with a fundamental frequency that is twice the input line excitation frequency. Accordingly, some implementations may reduce perceivable flicker, if any, by increasing the frequency at which the LED output illumination pulses. In some other embodiments, half or full wave rectification may be used. In some examples, rectification may operate from more than a single phase source, such as a 3, 4, 5, 6, 9, 12, 15 or more phase source.

FIGS. 22-25 depict experimental results collected by operation of an exemplary LED light engine circuit substantially as shown and described with reference to FIG. 21. In the experiments, the LEDs were model CL-L233-MC13L1, commercially available for example from Citizen Electronics Co., Ltd. of Japan. The tested LED Groups 1, 2, 4, 5 each included eight diodes in a series string, and LED Group 3 included twenty three diodes in a series string. The tested component values were specified as Rin at 500 Ohms and Rsense at 23.2 Ohms.

Figure 22:
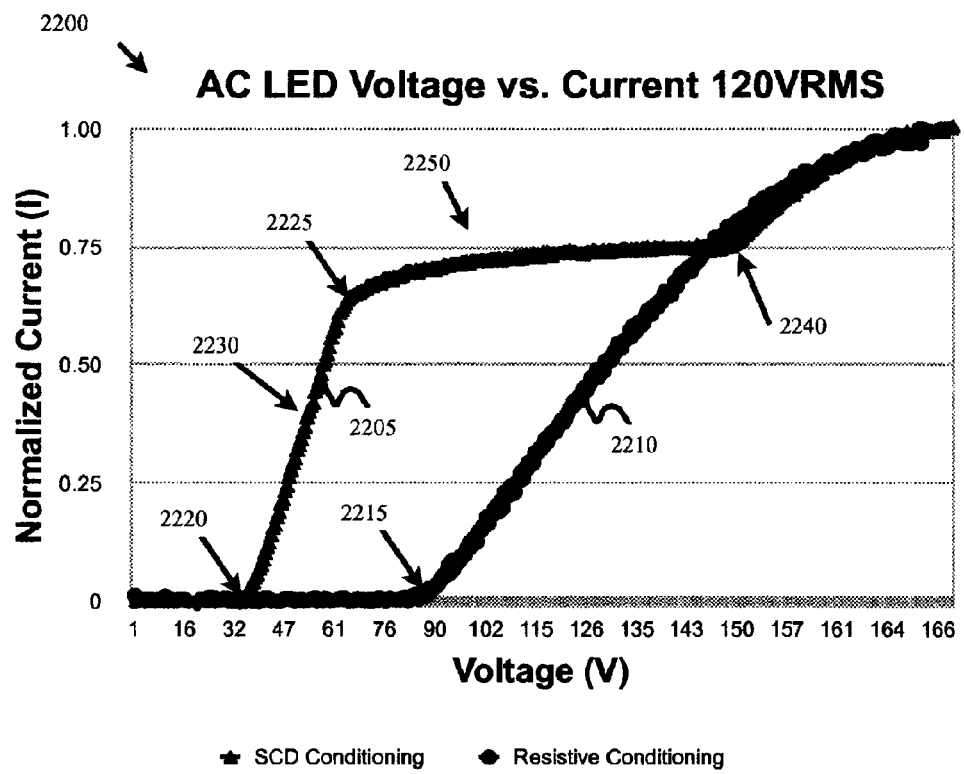
FIG. 22 shows a graph of normalized input current as a function of excitation voltage for the light engine circuit of FIG. 21.

FIG. 22 shows a graph of normalized input current as a function of excitation voltage for the light engine circuit of FIG. 21. As depicted, a graph 2200 includes a plot 2205 for input current with selective current diversion to condition the current, and a plot 2210 for input current with selective current diversion disabled. The plot 2210 may be referred to herein as being associated with resistive conditioning.

The experimental data shows that, for similar peak current, the effective forward threshold voltage at which substantial conduction begins was reduced from about 85 V (resistive conditioning) at point 2215 to about 40 V (selective current diversion) at a point 2220. This represents a reduction in threshold voltage of over 50%. When applied to both the rising and falling quadrants of each cycle, this corresponds to a substantial expansion of the conduction angle.

The plot 2205 shows a first inflection point 2220 that, in some examples, may be a function of the LED Groups 1, 2, 4, 5. In particular, the voltage at the inflection point 2220 may be determined based on the forward threshold voltage of the LED Groups 1, 2, 4, 5, and may further be a function of a forward threshold voltage of the operating branches of the bridge rectifier 2105.

The plot 2205 further includes a second inflection point 2225. In some examples, the second inflection point 2225 may correspond to a current threshold associated with the bypass control circuit. In various embodiments, the current threshold may be determined based on, for example, the input current.

A slope 2230 of the plot 2205 between the points 2220, 2225 indicates, in its reciprocal, that the light engine circuit 2100 with selective current diversion exhibits an impedance in this range that is substantially lower than any impedance exhibited by the plot 2210. In some implementations, this reduced impedance effect may advantageously promote enhanced light output by relatively rapidly elevating current at low excitation voltages, where LED current is roughly proportional to light output.

The plot 2205 further includes a third inflection point 2240. In some examples, the point 2240 may correspond to a threshold above which the current through the bypass switch path is substantially near zero. Below the point 2240, the bypass switch 2115 diverts at least a portion of the input current around the LED Group 3.

A variable slope shown in a range 2250 of the plot 2205 between the points 2225, 2240 indicates, in its reciprocal, that the bypass switch exhibits in this range a smoothly and continuously increasing impedance in response to increasing excitation voltage. In some implementations, this dynamic impedance effect may advantageously promote a smooth, substantially linear (e.g., low harmonic distortion) transition from the current flowing substantially only through the bypass switch 2115 to flowing substantially only in the LED Group 3.

Figures 23, 24, 25:
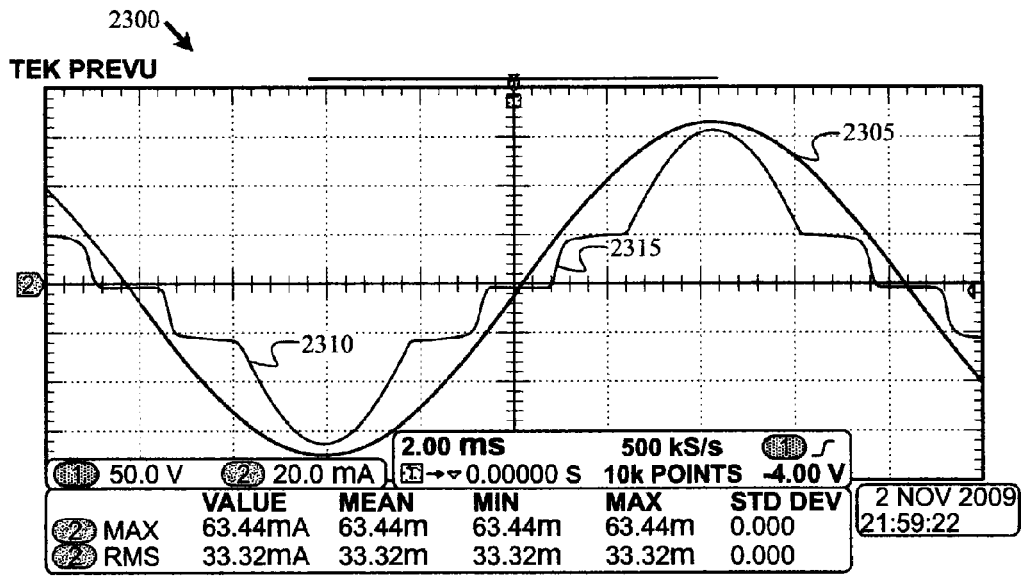
FIG. 23 depicts oscilloscope measurements of voltage and current waveforms for an embodiment of the circuit of FIG. 21.
FIG. 24 depicts power quality measurements for the voltage and current waveforms of FIG. 23.
FIG. 25 depicts a harmonic profile for the voltage and current waveforms of FIG. 23.

FIG. 23 depicts oscilloscope measurements of voltage and current waveforms for an embodiment of the circuit of FIG. 21. A plot 2300 depicts a sinusoidal voltage waveform 2305 and a current waveform 2310. The current waveform 2310 exhibits a head-and-shoulders shape.

In this example, a shoulder 2315 corresponds to current that flows through the bypass switch within a range of lower AC input excitation levels. Over a second intermediate range of AC input excitation levels, an impedance of the bypass current increases. As the excitation voltage continues to rise substantially smoothly and continuously within a third range that overlaps with the second range, a voltage across the bypass switch increases beyond an effective forward threshold voltage of the LED Group 3, and the input current transitions in a substantially smooth and continuous manner from flowing in the bypass switch 2115 to flowing through the LED Group 3. At higher AC input excitation levels, the current flows substantially only through the LED Group 3 instead of the bypass switch 2115.

In some embodiments, the first range may have a lower limit that is a function of an effective forward threshold voltage of the network formed by the LED Groups 1, 2, 4, 5. In some embodiments, the second range may have a lower limit defined by a predetermined threshold voltage. In some examples, the lower limit of the second range may correspond substantially to a predetermined threshold current. In some embodiments, the predetermined threshold current may be a function of a junction temperature (e.g., a base-emitter junction forward threshold voltage). In some embodiments, a lower limit of the third range may be a function of an effective forward threshold voltage of the LED Group 3. In some embodiments, an upper limit of the third range may correspond to the input current flowing substantially primarily (e.g., at least about 90%, 91%, 92%, 93%, 94%, 95%, 96%, 97%, 98%, 99%, or at least about 99.5% of the instantaneous input current to the load) through the LED Group 3. In some examples, the upper limit of the third range may be a function of the current flow through the bypass switch 2115 being substantially near zero (e.g., less than 0.5%, 1%, 2%, 3%, 4%, 5%, 6%, 7%, 8%, 9%, or less than about 10% of the instantaneous input current to the load).

FIG. 24 depicts power quality measurements for the voltage and current waveforms of FIG. 23. In particular, the measurements indicate that the power factor was measured to be about 0.987 (e.g., 98.7%).

FIG. 25 depicts a harmonic profile for the voltage and current waveforms of FIG. 23. In particular, the measured total harmonic distortion was measured at about 16.1%.

Accordingly, embodiments of an LED light engine with selective diversion circuitry may advantageously operate with a power factor substantially above 90%, 92.5%, 95%, 97.5%, or at least above about 98%, for example, and simultaneously achieve a THD substantially below 25%, 22.5%, 20%, or about 18%, for example, at the rated excitation voltage. Some embodiments of the AC LED light engine may further be substantially smoothly and continuously dimmable over a full range (e.g., 0-100%) of the applied excitation voltage under amplitude modulation and/or phase controlled modulation.

Figure 26:
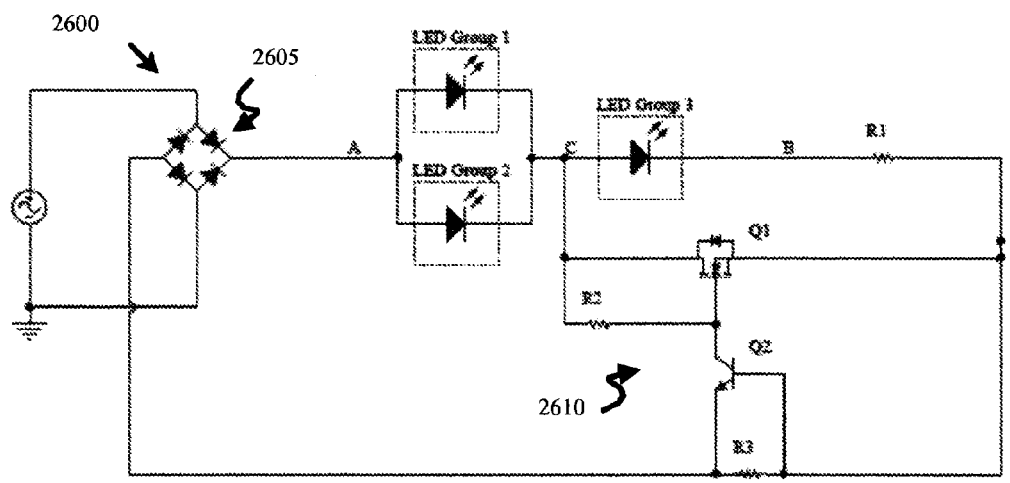
FIG. 26 shows a schematic of an exemplary circuit for an LED light engine with improved harmonic factor and/or power factor performance.

FIG. 26 shows a schematic of an exemplary circuit for an LED light engine with improved harmonic factor and/or power factor performance. Various embodiments may advantageously yield improved power factor and/or a reduced harmonic distortion for a given peak illumination output from the LEDs.

The light engine circuit 2600 includes a bridge rectifier 2605 and two parallel-connected groups of LEDs: LED Group 1 and LED Group 2, each containing multiple LEDs, and each connected between a node A and a node C. The circuit 2600 further includes an LED Group 3 connected between the node C and a node B. In operation, each of the LED Groups 1, 2, 3 may have an effective forward voltage that is a substantial fraction of the applied peak excitation voltage. Their combined forward voltage in combination with a current limiting element may control the peak forward current. The current limiting element is depicted as a resistor R1. In some embodiments, the current limiting element may include, for example, one or more elements in a combination, the elements being selected from among a fixed resistor, current controlled semiconductor, and a temperature-sensitive resistor.

The light engine circuit 2600 further includes a bypass circuit 2610 that operates to reduce the effective forward turn-on voltage of the circuit 2600. In various embodiments, the bypass circuit 2610 may contribute to expanding the conduction angle at low AC input excitation levels, which may tend to benefit power factor and/or harmonic factor, e.g., by constructing a more sinusoidal-shaped current waveform.

The bypass circuit 2610 includes a bypass transistor Q1 (e.g., metal oxide semiconductor (MOS) field effect transistor (FET), IGBT (insulated gate bipolar transistor), bipolar junction transistor (BJT), or the like) with its channel connected to divert current from the node C and around the LED Group 3 and the series resistor R1. The conductivity of the channel is modulated by a control terminal (e.g., gate of the MOSFET). The gate of the n-channel MOSFET Q1 is pulled up in voltage through a resistor R2 to the node C. In some other embodiments, the resistor may be pulled up to the node A. The gate voltage can be reduced by a pull down transistor Q2 (e.g., MOSFET, IGBT, junction FET (JFET), bipolar junction transistor (BJT), or the like) to a voltage near a voltage of the source of the transistor Q1. In the depicted example, a collector of the transistor Q2 (NPN bipolar junction transistor (BJT)) is configured to regulate the gate voltage in response to a load current establishing a base-emitter voltage for the transistor Q2. A sense resistor R3 is connected across the base-emitter of the transistor Q2. In various embodiments, the voltage on the gate of the transistor Q1 may be substantially smoothly and continuously varied in response to corresponding smooth and continuous variations in the input current magnitude.

FIGS. 27-29 and 36-37 depict experimental results collected by operation of an exemplary LED light engine circuit substantially as shown and described with reference to FIG. 26. In the experiments, the LED Groups 1, 2 were model EHP_A21_GT46H (white), commercially available for example from Everlight Electronics Co., LTD., of Taiwan. The LED Group 3 included model EHP_A21_UB 01H (blue), also commercially available for example from Everlight Electronics Co., LTD. of Taiwan. The tested LED Groups 1, 2 each included twenty-four diodes in a series string, and the LED Group 3 included twenty-one diodes in a series string. The tested component values were specified as R1 at 13.4 Ohms, R2 at 4.2 Ohms, and R3 at 806 kOhms.

Figure 27:
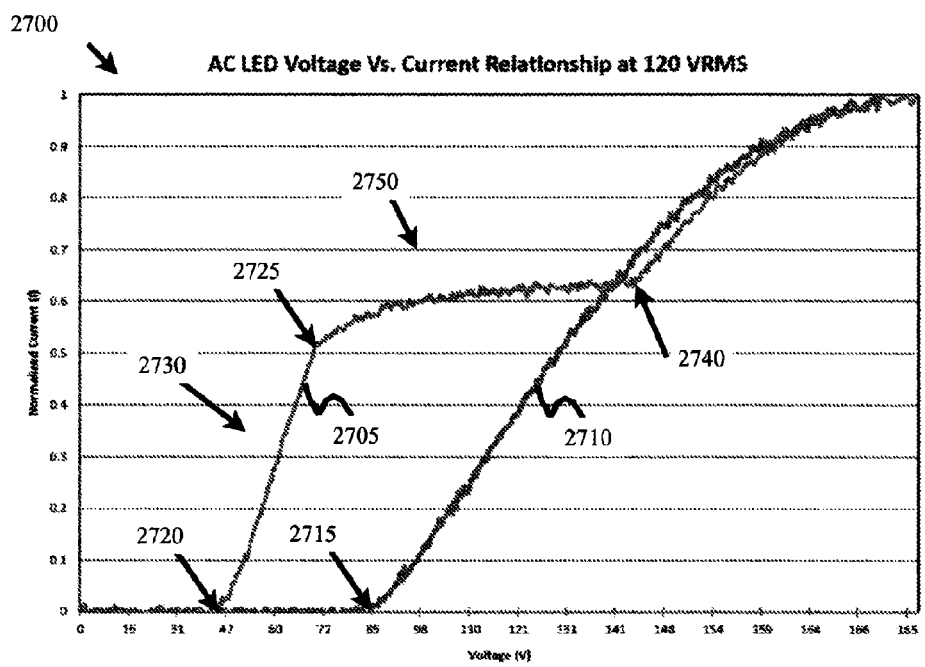
FIG. 27 shows a graph of normalized input current as a function of excitation voltage for the light engine circuit of FIG. 26.

FIG. 27 shows a graph of normalized input current as a function of excitation voltage for the light engine circuit of FIG. 26. As depicted, a graph 2700 includes a plot 2705 for input current with selective current diversion to condition the current, and a plot 2710 for input current with selective current diversion disabled. The plot 2710 may be referred to herein as being associated with resistive conditioning.

The experimental data shows that, for a similar peak current, the effective forward threshold voltage at which substantial conduction begins was reduced from about 85 V (resistive conditioning) at point 2715 to about 45 V (selective current diversion) at a point 2720. This represents a reduction in threshold voltage of about 45%. When applied to both the rising and falling quadrants of each rectified sinusoid cycle, this corresponds to a substantial expansion of the conduction angle.

The plot 2705 shows the first inflection point 2720 that, in some examples, may be a function of the LED Groups 1, 2. In particular, the voltage at the inflection point 2720 may be determined based on the forward threshold voltage of the LED Groups 1, 2, and may further be a function of a forward threshold voltage of the operating branches of the bridge rectifier 2605.

The plot 2705 further includes a second inflection point 2725. In some examples, the second inflection point 2725 may correspond to a current threshold associated with the bypass circuit 2610. In various embodiments, the current threshold may be determined based on, for example, the input current, base-emitter junction voltage, temperature, current gain, and/or the transfer characteristics for the transistor Q1.

A slope 2730 of the plot 2705 between the points 2720, 2725 indicates, in its reciprocal, that the light engine circuit 2600 with selective current diversion exhibits an impedance in this range that is substantially lower than any impedance exhibited by the plot 2710. In some implementations, this reduced impedance effect may advantageously promote, for example, enhanced light output by relatively rapidly elevating current at low excitation voltages, where LED current is roughly proportional to light output.

The plot 2705 further includes a third inflection point 2740. In some examples, the point 2740 may correspond to a threshold above which the current through the transistor Q1 is substantially near zero. Below the point 2740, the transistor Q1 diverts at least a portion of the input current around the LED Group 3.

A variable slope shown in a range 2750 of the plot 2705 between the points 2725, 2740 indicates, in its reciprocal, that the transistor Q1 exhibits in this range a smoothly and continuously increasing impedance in response to increasing excitation voltage. In some implementations, this dynamic impedance effect may advantageously promote a smooth, substantially linear (e.g., low harmonic distortion) transition from the current flowing substantially only through the transistor Q1 to flowing substantially only in the LED Group 3.

Figures 28, 29:
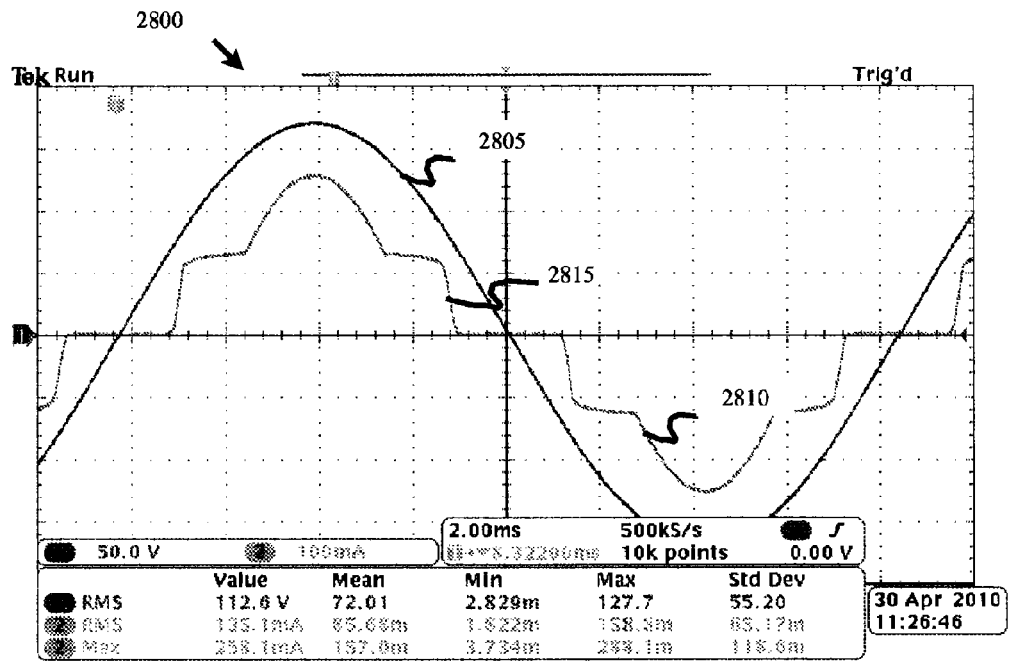
FIG. 28 depicts oscilloscope measurements of voltage and current waveforms for an embodiment of the circuit of FIG. 26.
FIG. 29 depicts power quality measurements for the voltage and current waveforms of FIG. 28.

FIG. 28 depicts oscilloscope measurements of voltage and current waveforms for an embodiment of the circuit of FIG. 26. A plot 2800 depicts a sinusoidal voltage waveform 2805 and a current waveform 2810. The current waveform 2810 exhibits a head-and-shoulders shape.

In this example, shoulders 2815 correspond to current that flows through the transistor Q1 within a range of lower AC input excitation levels. Over a second intermediate range of AC input excitation levels, an impedance of the transistor Q1 increases. As the excitation voltage continues to rise substantially smoothly and continuously within a third range that overlaps with the second range, a voltage across the transistor Q1 increases beyond an effective forward threshold voltage of the LED Group 3, and the input current transitions in a substantially smooth and continuous manner from flowing in the transistor Q1 to flowing through the LED Group 3. At higher AC input excitation levels, the current flows substantially only through the LED Group 3 instead of the transistor Q1.

In some embodiments, the first range may have a lower limit that is a function of an effective forward threshold voltage of the network formed by the LED Groups 1, 2. In some embodiments, the second range may have a lower limit defined by a predetermined threshold voltage. In some examples, the lower limit of the second range may correspond substantially to a predetermined threshold current. In some embodiments, the predetermined threshold current may be a function of a junction temperature (e.g., a base-emitter junction forward threshold voltage). In some embodiments, a lower limit of the third range may be a function of an effective forward threshold voltage of the LED Group 3. In some embodiments, an upper limit of the third range may correspond to the input current flowing substantially primarily (e.g., at least about 95%, 96%, 97%, 98%, 99%, or at least about 99.5% of the instantaneous input current to the load) through the LED Group 3. In some examples, the upper limit of the third range may be a function of the current flow through the transistor Q1 being substantially near zero (e.g., less than 0.5%, 1%, 2%, 3%, 4%, or less than about 5% of the instantaneous input current to the load).

FIG. 29 depicts power quality measurements for the voltage and current waveforms of FIG. 28. In particular, the measurements indicate that the power factor was measured to be about 0.967 (e.g., 96.7%).

Figures 30, 31:
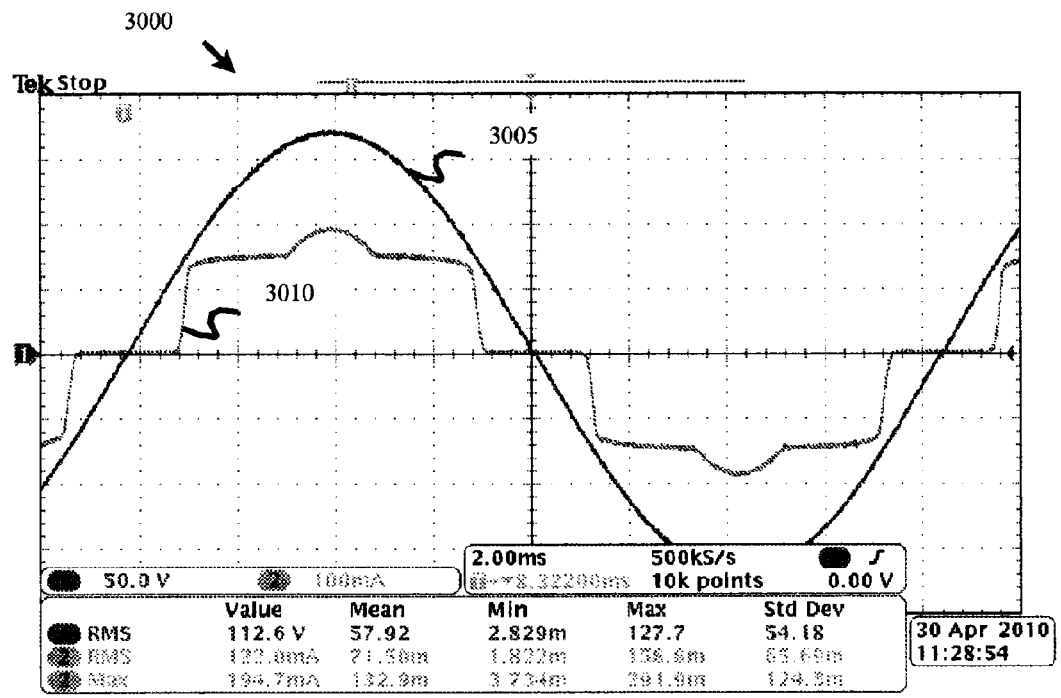
FIG. 30 depicts oscilloscope measurements of voltage and current waveforms for another embodiment of the circuit of FIG. 26.
FIG. 31 depicts power quality measurements for the voltage and current waveforms of FIG. 30.

FIGS. 30-31 depict experimental results collected by operation of an exemplary LED light engine circuit substantially as shown and described with reference to FIG. 26. In the experiments, the LED Groups 1, 2, 3 included model SLHNNWW629T0, commercially available for example from Samsung LED Co, LTD. of Korea. The LED Group 3 further included model AV02-0232EN, commercially available for example from Avago Technologies of California. The tested LED Groups 1, 2 each included twenty-four diodes in a series string, and the LED Group 3 included eighteen diodes in a series string. The tested component values were specified as R1 at 47 Ohms, R2 at 3.32 Ohms, and R3 at 806 kOhms.

FIG. 30 depicts oscilloscope measurements of voltage and current waveforms for another embodiment of the circuit of FIG. 26. A plot 3000 depicts a sinusoidal excitation voltage waveform 3005 and a plot of an input current waveform 3010. The current waveform 3010 exhibits a head-and-shoulders shape, substantially as described with reference to FIG. 28, with modified characteristic thresholds, inflection points, or slopes.

FIG. 31 depicts power quality measurements for the voltage and current waveforms of FIG. 30. In particular, the measurements indicate that the power factor was measured to be about 0.978 (e.g., 97.8%).

FIGS. 32-35 depict experimental results collected by operation of an exemplary LED light engine circuit substantially as shown and described with reference to FIG. 26. In the experiments, the LED Groups 1, 2 included model SLHNNWW629T0 (white), commercially available for example from Samsung LED Co, LTD. of Korea, and model AV02-0232EN (red), commercially available for example from Avago Technologies of California. The LED Group 3 included model CL-824-U1D (white), commercially available for example from Citizen Electronics Co., Ltd. of Japan. The tested LED Groups 1, 2 each included twenty-four diodes in a series string, and the LED Group 3 included twenty diodes in a series string. The tested component values were specified as R1 at 715 Ohms, R2 at 23.2 Ohms, and R3 at 806 kOhms.

Figures 32, 33:
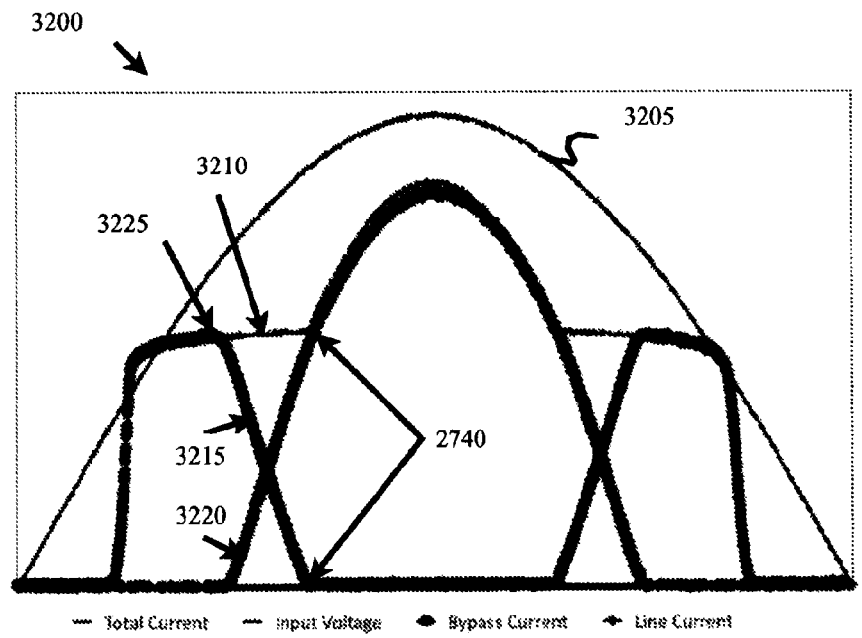
FIG. 32 show oscilloscope measurements of voltage and current waveforms for the embodiment of the circuit of FIG. 26 as described with reference to FIGS. 27-29.
FIG. 33 depicts power quality measurements for the voltage and current waveforms of FIG. 32.

FIG. 32 show oscilloscope measurements of voltage and current waveforms for the embodiment of the circuit of FIG. 26 as described with reference to FIGS. 27-29. As depicted, a graph 3200 includes sinusoidal excitation voltage waveform 3205, a total input current waveform 3210, a waveform 3215 for current through the transistor Q1, and a waveform 3220 for current through the LED Group 3.

With reference to FIG. 27, the experimental data suggests that for excitation voltages within between the first inflection point 2720 and the second inflection point 2725, the total input current waveform 3210 substantially matches the waveform 3215. The input current and current through the transistor Q1 remain substantially equal over a range of excitations above the second inflection point 2725. However, at a transition inflection point 3225 in the range 2750 between the points 2725, 2740, the waveform 3215 begins to decrease at a rate that is substantially offset by a corresponding increase in the waveform 3220. The waveforms 3215, 3220 appear to have equal and opposite, approximately constant (e.g., linear) slope as the excitation voltage rises voltage corresponding to the inflection point 3225 to the voltage corresponding to the inflection point 2740. At excitation voltages above the point 2740, the waveform 3220 for current through the LED Group 3 substantially equals the input current waveform 3210.

FIG. 33 depicts power quality measurements for the voltage and current waveforms of FIG. 32. In particular, the measurements indicate that the power factor was measured to be about 0.979 (e.g., 97.9%).

Figures 34, 35:
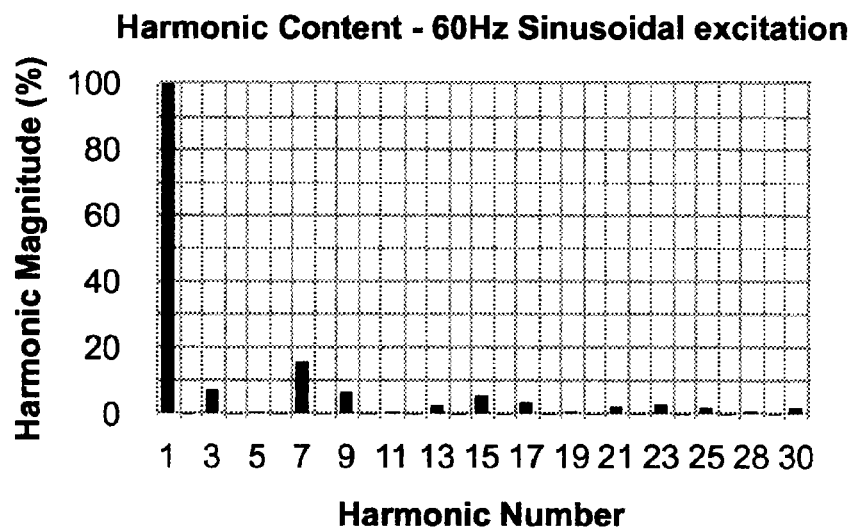
FIG. 34 depicts harmonic components for the waveforms of FIG. 32.
FIG. 35 depicts a harmonic profile for the voltage and current waveforms of FIG. 32.

FIG. 34 depicts harmonic components for the waveforms of FIG. 32. In particular, the harmonic magnitudes were measured substantially only as odd harmonics, the strongest being a 7th harmonic at less than 20% of the fundamental.

FIG. 35 depicts a harmonic profile for the voltage and current waveforms of FIG. 32. In particular, the measured total harmonic distortion was measured at about 20.9%.

Accordingly, embodiments of an AC LED light engine with selective diversion circuitry may advantageously operate with less than 30%, 29%, 28%, 27%, 26%, 25%, 24%, 23%, 22%, or less than about 21% THD, and where the magnitudes of the harmonics at frequencies above one kHz, for example, are substantially less than about 5% of the amplitude of the fundamental frequency.

Figures 36, 37:
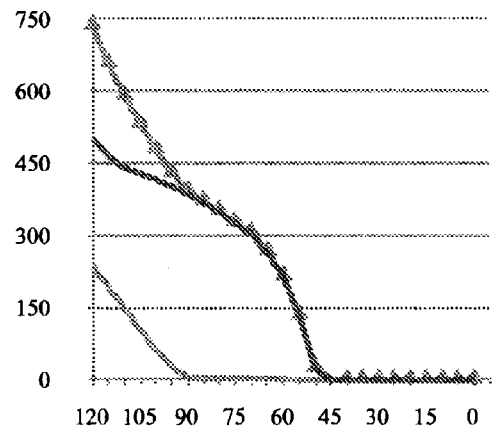
FIGS. 36-37 shows a plot and data for experimental measurements of light output for a light engine as described with reference to FIG. 27.

FIGS. 36-37 shows a plot and data for experimental measurements of light output for a light engine as described with reference to FIG. 27. During experimentation with the applied excitation voltage at 120 Vrms, the light output was measured to exhibit about a 20% optical loss associated with a lens and a white-colored (e.g., substantially parabolic) reflector. At full excitation voltage (120 Vrms), the measured input power was 14.41 Watts.

Accordingly, embodiments of an AC LED light engine with selective diversion circuitry may advantageously operate with at least about 42, 44, 46, 48, 50, or about 51 lumens per watt, and with a power factor of at least 90%, 91%, 92%, 93%, 94%, 95%, or at least 96% when supplied with about 120 Vrms sinusoidal excitation. Some embodiments of the AC LED light engine may further be substantially smoothly and continuously dimmable over a full range (e.g., 0-100%) of the applied excitation voltage under amplitude modulation and/or phase controlled modulation.

FIG. 36 shows a graph of calculated components of the light output, and the combined total output calculation, at a range of dimming levels. The graph indicates that the selective diversion circuitry in this implementation provides a smoothly dimmable light output over a substantial voltage range. In this example, the light output was smoothly (e.g., continuous, monotonic variation) reduced from 100% at full rated excitation (e.g., 120 V in this example) to 0% at about 37% of rated excitation (e.g., 45 V in this example). Accordingly, a usable control range for smooth dimming using amplitude modulation of some implementation of an AC LED light engine with selective current diversion to condition the current may be at least 60% or at least about 63% of the rated excitation voltage.

FIG. 37 shows experimental data for the calculated components of the light output, and the combined total output calculation, at a range of dimming levels. The LED Groups 1, 2 output light of at least 5 lumens down to below 50 Volts, and the LED Group 3 output light of at least 5 lumens down to about 90 Volts.

Figure 38:
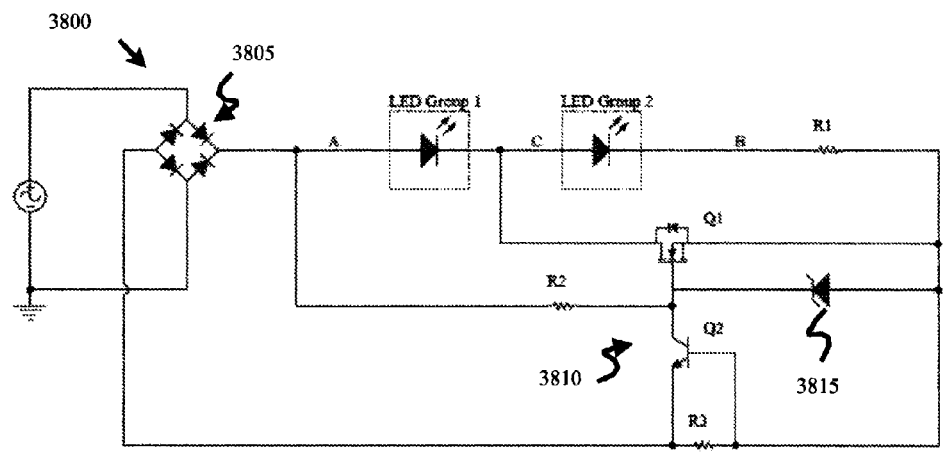
FIG. 38-43 shows schematics of exemplary circuits for an LED light engine with selective current diversion to bypass one or more groups of LEDs while AC input excitation is below a predetermined level.

FIG. 38 shows a schematic of an exemplary circuit for an LED light engine with selective current diversion to bypass a group of LEDs while AC input excitation is below a predetermined level. Various embodiments may advantageously yield improved power factor and/or a reduced harmonic distortion for a given peak illumination output from the LEDs.

The light engine circuit 3800 includes a bridge rectifier 3805 and two series-connected groups of LEDs: LED Group 1 and LED Group 2, each containing multiple LEDs. In operation, each of the LED Group 1, 2 may have an effective forward voltage that is a substantial fraction of the applied peak excitation voltage. Their combined forward voltage in combination with a current limiting element may control the peak forward current. The current limiting element is depicted as resistor R1. In some embodiments, the current limiting element may include, for example, one or more elements in a combination, the elements being selected from among a fixed resistor, current controlled semiconductor, and a temperature-sensitive resistor.

The light engine circuit 3800 further includes a bypass circuit 3810 that operates to reduce the effective forward turn-on voltage of the circuit 3800. In various embodiments, the bypass circuit 3810 may contribute to expanding the conduction angle at low AC input excitation levels, which may tend to benefit power factor and/or harmonic factor, e.g., by constructing a more sinusoidal-shaped current waveform.

The bypass circuit 3810 includes a bypass transistor Q1 (e.g., MOSFET, IGBT, bipolar, or the like) with its channel connected in parallel with the LED Group 2. The conductivity of the channel is modulated by a control terminal (e.g., gate of the MOSFET). In the depicted example, the gate is pulled up in voltage through a resistor R2 to a positive output terminal (node A) of the rectifier, but can be pulled down to a voltage near a voltage of the source of the transistor Q1 by a collector of an NPN transistor Q2. In various embodiments, the voltage on the gate of the transistor Q1 may be substantially smoothly and continuously varied in response to corresponding smooth and continuous variations in the input current magnitude, which flows through sense resistor R3. The NPN transistor Q2 may pull down the gate voltage of the transistor Q1 when a base-emitter of the NPN transistor Q2 is forward biased by sufficient LED current through a sense resistor R3.

The depicted example further includes an exemplary protection element to limit the gate-to-source voltage of the MOSFET. In this example, a zener diode 3815 (e.g., 14V breakdown voltage) may serve to limit the voltage applied to the gate to a safe level for the transistor Q1.

Figure 39:
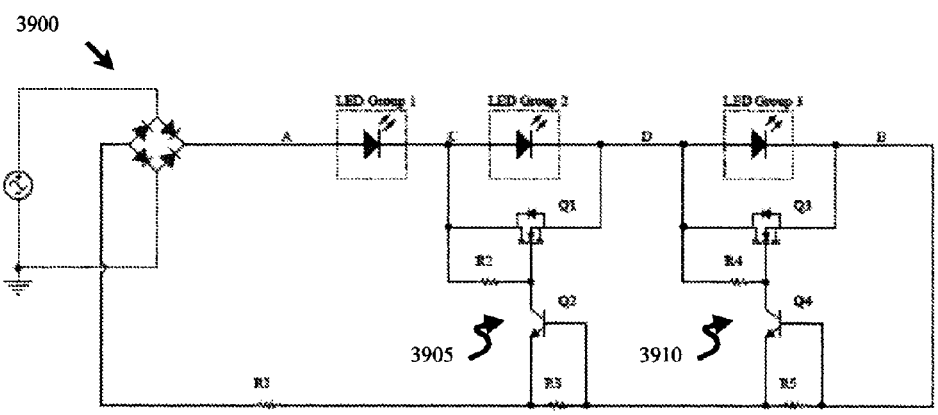

FIG. 39 depicts a schematic of an exemplary circuit for an LED light engine with selective current diversion to bypass two groups of LEDs while AC input excitation is below two corresponding predetermined levels.

A light engine circuit 3900 includes an additional group of LEDs and a corresponding additional bypass circuit in a series arrangement with the light engine circuit of FIG. 38. The light engine circuit 3900 includes an LED Group 1 connected between a node A and a node C, an LED Group 2 connected between the node C and a node D, and an LED Group 3 connected between the node D and a node B in series with LED Groups 1,2. In parallel with the LED Groups 2, 3 are bypass circuits 3905, 3910, respectively, to provide two levels of selective current diversion.

In the depicted embodiment, the bypass circuits 3905, 3910 include pull-up resistors R2, R4 connected to pull their respective gate voltages up to the nodes C, D, respectively. In an another embodiment, the pull-up resistors R2, R4 may be connected to pull up their respective gate voltages to the nodes A, C, respectively. An example of such an embodiment is described with reference at least to FIG. 5B of U.S. Provisional Patent Application entitled "LED Lighting for Livestock Development," Ser. No. 61/255,855, which was filed by Z. Grajcar on Oct. 29, 2009, the entire contents of which are incorporated herein by reference.

In various embodiments, and in accordance with the instant disclosure, setting appropriate current and voltage thresholds for each of the bypass circuits 3905, 3910, may yield improved performance in terms of at least THD and power factor, taken separately or in combination, in an AC LED light engine such as the light engine 3900.

As excitation voltage and input current are increasing in the light engine circuit 3900, for example, one of the bypass circuits may transition from low to high impedance over a first range of excitation, and the other bypass circuit may transition from low to high impedance over a second range of excitation. In some implementations, the respective voltage and current thresholds for each of the respective bypass circuits may be set so that the first and second ranges of excitation at least partially overlap. Such overlapping ranges of excitation may be arranged by appropriate selection of current and voltage thresholds to yield, for example an optimal THD performance with improved power factor. In some other implementations, the first and second ranges of excitation may have substantially no overlap, which may advantageously promote a wider conduction angle, for example, to achieve near unity (e.g., about 97%, 98%, 98.5%, 99%, 99.25%, 99.5%, or about 99.75%) power factor, for example.

Various embodiments may advantageously provide for two, three, or more bypass circuits, for example, to permit additional degrees of freedom in constructing a more sinusoidal-shaped current waveform, and/or expanding the conduction angle closer to 180 degrees per half-cycle. Additional circuits may introduce additional degrees of freedom, which in turn may yield further improvements to power factor and further reductions in harmonic distortion for a given peak illumination output from the LEDs.

Figure 40:
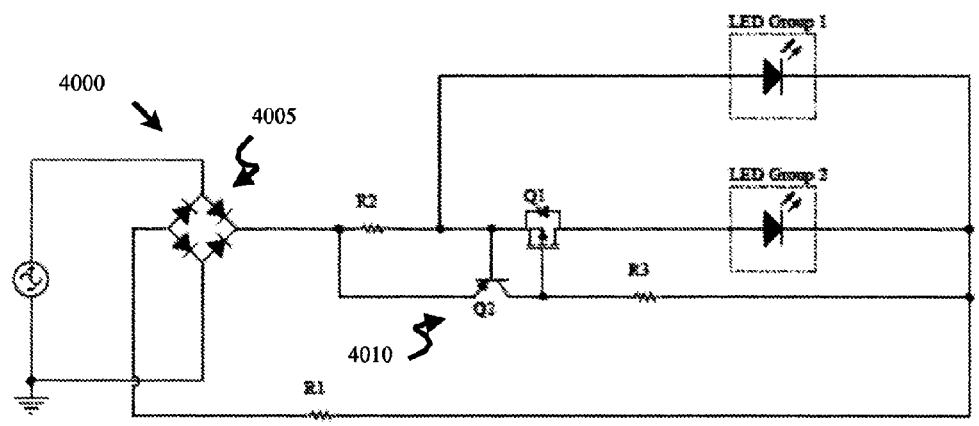

FIG. 40 shows a schematic of an exemplary circuit for an LED light engine with selective current diversion to bypass a group of LEDs while AC input excitation is below a predetermined level. The schematic depicted in FIG. 40 includes one embodiment of a bridge rectifier 4005, a current limiting resistor R1, and two parallel LED paths, one of which is interruptible by a bypass circuit 4010.

The light engine circuit 4000 includes the bridge rectifier 4005, which supplies a unidirectional load current through a resistor R1. The load current flows through a sense resistor R2 to two parallel groups of LEDs: LED Group 1 and LED Group 2, each formed of multiple LEDs (e.g., arranged in series, parallel, or combined series-parallel network). The load current also supplies to the bypass circuit 4010 a bias current that may flow around the LED Groups 1, 2. The bypass circuit 4010 includes a P-channel MOSFET transistor Q1 in series with the current path through the LED Group 2. The transistor Q1 is connected so that a drain current flows from the resistor R2 to the LED Group 2. A voltage of a gate of the transistor Q1 is controlled by a PNP bipolar junction transistor Q2 with its base-emitter voltage controlled in response to the load current to the LED Groups 1, 2 through the sense resistor R2. A collector current flowing in response to the load current through the resistor R2 results in a collector current through the transistor Q2 and a bias resistor R3. The gate voltage is a function of the voltage across the resistor R3. As the collector current increases, for example, the gate voltage rises. In operation at rated excitation voltage, the gate voltage increases correspond to a smooth transition in the transistor Q1 from a substantially low impedance state (e.g., less than 100, 50, 30, 20, 10, 5.1, 0.5, 0.1, 0.05 Ohms), to an increasing impedance state (e.g., equivalent circuit of a substantially constant current source in parallel with a resistance), to a high impedance state (e.g., substantially open circuit).

Each of the LED Groups 1, 2 may have an effective forward voltage that is a fraction of the applied peak excitation voltage, and substantially all the load current may be divided among the LED Groups 1, 2. When the applied excitation voltage is sufficient to overcome the effective forward threshold voltage of the LED Group 1, then the load current through the resistor R2 will increase in response to the current flow through the LED Group 1. In some embodiments, the current flow through the LED Group 2 may decrease substantially smoothly and continuously in response to the current through the sense resistor substantially smoothly and continuously increasing within a range. In some implementations, this range may correspond to an excitation voltage substantially above the effective forward threshold voltage of the LED Group 1.

In an exemplary operation, the LED Group 2 may have a substantially lower effective forward threshold voltage than the LED Group 1. According to some embodiments during a continuous and smooth increase of AC excitation, the load current may flow first through LED Group 1. As excitation rises above the effective forward threshold voltage of the LED Group 1, the load current flows through both LED Groups 1, 2. As the load current reaches a threshold, the current through the LED Group 2 may smoothly and continuously transition toward zero as the bypass circuit 4010 increases an impedance of the channel of the transistor Q1. Above some threshold current value the load current flows substantially only through the LED Group 1, with a small fraction of the load current supplying the bias current to the transistor Q2 in the bypass circuit 4010.

The light engine circuit 4000 thus includes a bypass circuit 4010 that operates to reduce the effective forward turn-on voltage of the circuit 4000. In various embodiments, the bypass circuit 4010 may contribute to expanding the conduction angle at low AC input excitation levels, which may tend to benefit power factor and/or harmonic factor, e.g., by constructing a more sinusoidal-shaped current waveform.

Figure 41:
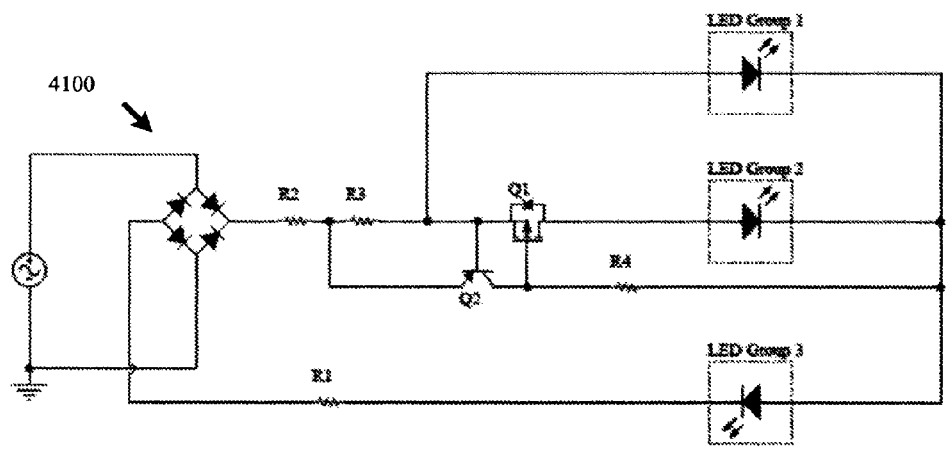

FIG. 41 shows a schematic of an exemplary circuit for the LED light engine of FIG. 40 with an additional LED group in a series arrangement. In this embodiment, the light engine circuit 4000 is modified to include an LED Group 3 connected in series with the series resistor R1. In the depicted example, the LED Group 3 may increase the effective forward threshold voltage requirement for the LED Groups 1, 2.

Over an illustrative smoothly and continuously increasing excitation voltage, some embodiments may provide that the LED Group 3 is illuminating when the LED Group 1 is illuminating at low excitation levels, when the LED Groups 1, 2 are illuminating at intermediate excitation levels, and when the LED Group 2 is illuminating and the LED Group 1 is not illuminating at higher excitation levels.

In an illustrative example, some embodiments may use different colors in the LED Group 1 and LED Group 2 to provide substantially different composite color temperatures as a function of excitation level (e.g., color shifts in response to dimming level within a range of 0-100% of rated voltage).

Some embodiments may achieve a desired color shift capability by appropriate selection of spectral output for each of the LED Groups 1, 2, and 3.

Figure 42:
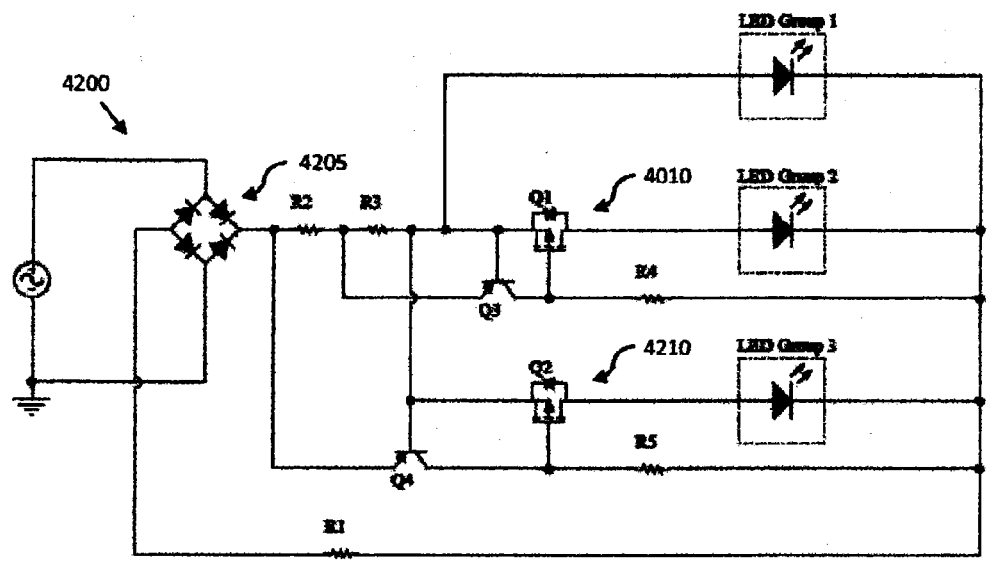

FIG. 42 shows a schematic of another exemplary circuit for an LED light engine with selective current diversion to bypass a group of LEDs while AC input excitation is below a predetermined level. The schematic depicted in FIG. 42 includes one embodiment of a light engine circuit that includes a bridge rectifier 4205, current limiting resistor R1, and three parallel LED paths, two of which are interruptible by independent bypass circuits, substantially as described above with reference to FIG. 40.

The schematic of FIG. 42 includes the elements of the light engine circuit 4000 of FIG. 40, and further includes a third parallel path that includes an LED Group 3 that is interruptible by a bypass circuit 4210. In this embodiment, the bypass circuits 4010, 4210 include a p-channel MOSFET Q1, Q2, respectively, as the bypass transistor. A gate of each of the bypass transistors Q1, Q2 is controlled by a PNP type bipolar junction transistor Q3, Q4. The PNP transistors Q3, Q4 are arranged to respond to current through two current sense resistors R2, R3. In this example, the bypass circuit 4210 for the LED Group 3 turns off at a lower excitation threshold than the corresponding threshold at which the LEDs2 turns off.

Figure 43:
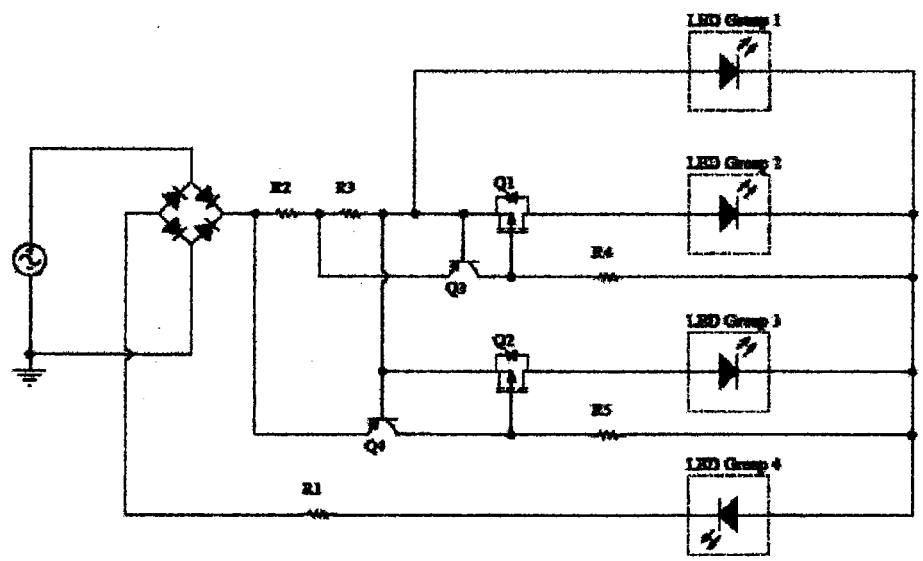

FIG. 43 show a schematic of a further exemplary circuit for an LED light engine with selective current diversion to bypass a group of LEDs while AC input excitation is below a predetermined level. The schematic depicted in FIG. 43 includes one embodiment of a light engine circuit substantially as described above with reference to FIG. 42, and further includes an additional LED group substantially as described with reference to FIG. 41.

FIG. 43 shows a schematic of an exemplary circuit for the LED light engine of FIG. 42 with an additional LED group in a series arrangement. In this embodiment, the light engine circuit 4200 is modified to include an LED Group 4 connected in series with the series resistor R1. In the depicted example, the LED Group 4 may increase the effective forward threshold voltage requirement for the LED Groups 1, 2, and 3.

Figure 44:
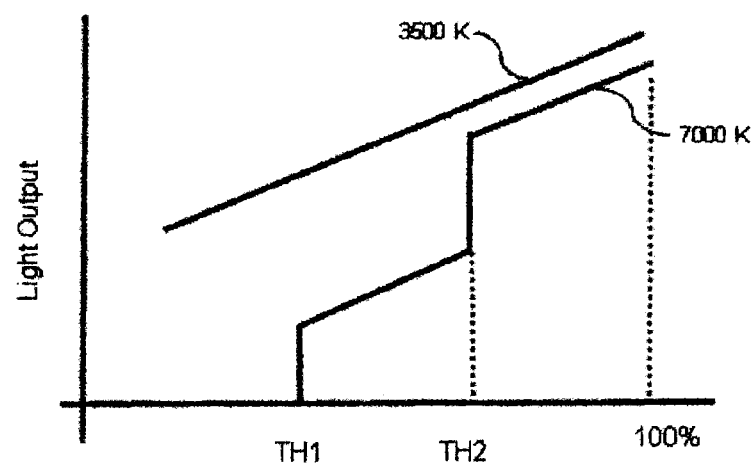
FIGS. 44-45 shows graphs to illustrate an exemplary composite color temperature variation over a range of dimmer control settings for an embodiment of the light engine of FIG. 9.
Figure 45:
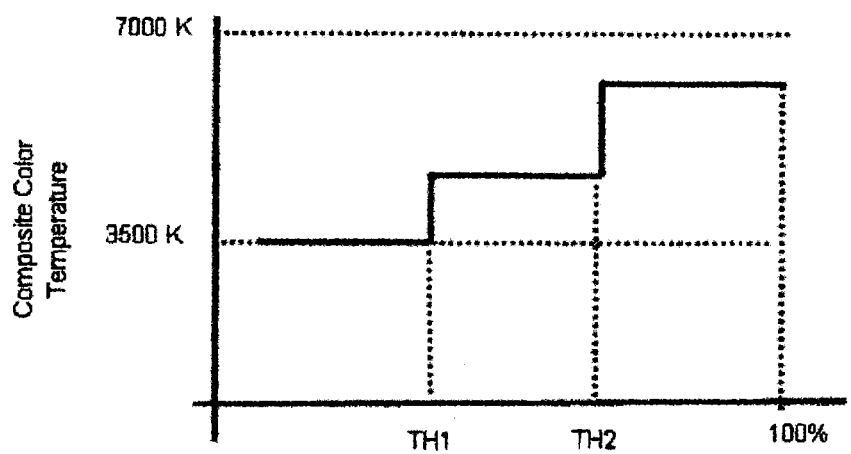

FIGS. 44-45 shows graphs to illustrate an exemplary composite color temperature variation over a range of dimmer control settings for an embodiment of the light engine of FIG. 9. FIG. 9 shows a schematic of an exemplary AC LED source having LEDs that, for purposes of this example, may include two different color temperatures between load LEDs (D1-D18) and LEDs that form a bridge rectifier. While providing improved conduction angle, the selective diversion circuitry SC1, SC2 can further provide a controlled color temperature shift over a range of input excitation conditions.

For purposes of simplifying the explanation, the dimmer may modulate the rms (root-mean-square) amplitude of the rectified sinusoidal excitation voltage using phase-control or pulse-width modulation (PWM), for example.

In the example circuit of FIG. 9, two bypass switches are provided at different threshold settings: Th1 for SC1 and Th2 for SC2. For purposes of this illustrative example, the LEDs that form the full wave bridge rectifier have a nominal color temperature of 3500 K, and the LEDs that form the unidirectional current load have a nominal color temperature of 7000 K.

FIG. 44 shows a plot of light output versus dimmer control setting. At low dimmer control settings, all of the 7000 K LEDs are bypassed. As the dimmer control increases, the light output of the 3500 K LEDs increases. When the dimmer control setting reaches a point of sufficient excitation to meet the threshold condition TH1, then current diversion away from the LEDs D1-D9 LEDs is interrupted, allowing the light output of the 7000 K LEDs to increase.

As the dimmer control setting continues to increase, it eventually reaches a point sufficient to meet the threshold condition TH2. At this point, current diversion from the LEDs D10-D18 is interrupted, allowing the light output of the 7000 K LEDs to further increase.

FIG. 45 illustrates how the light output variation of the 3500 K and 7000 K LEDs may lead to variation in the composite color temperature. At the lowest dimmer control settings, substantially all of the light output is output from the 3500 K LEDs. Accordingly, the color temperature is around 3500 K.

As the dimmer control settings increase, the 7000 K LEDs begin to contribute light output that combines with the 3500 K LED light output to form a composite light output. The contributions to the light output are dependent on the magnitude of the light output contributed by each LED source.

In some implementations, the slope of the composite color temperature curve in FIG. 45 may not necessarily be flat, such as in the range between thresholds TH1, TH2, for example. The actual slope may depend on the relative responses of the light output characteristics for, in this example, the 3500 K and 7000 K LEDs.

Figure 46:
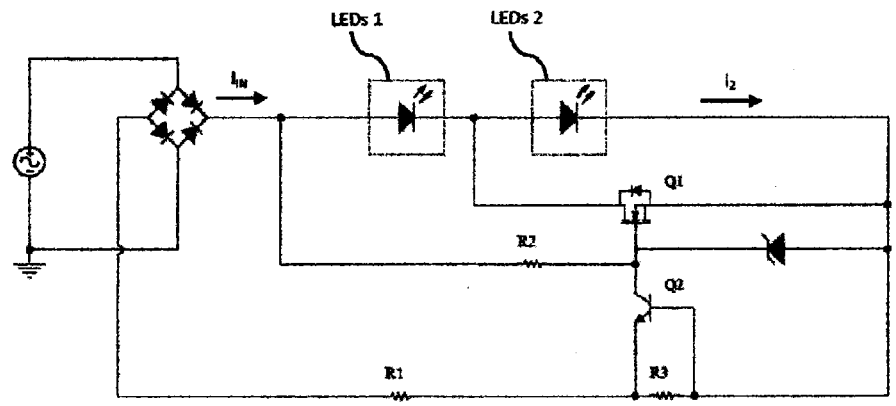
FIG. 46 shows a schematic of an exemplary circuit for an LED light engine with selective current diversion to bypass a group of LEDs while AC input excitation is below a predetermined level.

FIG. 46 shows a schematic of an exemplary circuit for an LED light engine with selective current diversion to bypass a group of LEDs while AC input excitation is below a predetermined level. Various embodiments may advantageously yield improved power factor and/or a reduced harmonic distortion for a given peak illumination output from the LEDs.

The light engine circuit of FIG. 46 includes a bridge rectifier and two groups of LEDs: LEDs1 and LEDs2 each containing a series and/or parallel network of multiple LEDs. In operation, each group of LEDs1, 2 may have an effective forward voltage that is a substantial fraction of the applied peak excitation voltage. Their combined forward voltage in combination with a current limiting element may control the forward current. The current limiting element may include, for example, a fixed resistor.

The light engine circuit further includes a bypass circuit that operates to reduce the effective forward turn-on voltage of the circuit. In various embodiments, the bypass circuit may contribute to expanding the conduction angle at low AC input excitation levels, which may tend to benefit power factor and/or harmonic factor, e.g., by constructing a more sinusoidal-shaped current waveform.

The bypass circuit includes a bypass transistor (e.g., MOSFET, IGBT, bipolar, or the like) with its channel connected in parallel with the LEDs2. The conductivity of the channel is modulated by a control terminal (e.g., gate of the MOSFET). In the depicted example, the gate is pulled up in voltage through a resistor to a positive output terminal of the rectifier, but can be pulled down to a voltage near a voltage of the source of the MOSFET by a collector of an NPN transistor. The NPN transistor may pull down the MOSFET gate voltage when a base-emitter of the NPN transistor is forward biased by sufficient LED current through a sense resistor.

The depicted example further includes an exemplary protection element to limit the gate-to-source voltage of the MOSFET. In this example, a zener diode (e.g., 14V breakdown voltage) may serve to limit the voltage applied to the gate to a safe level for the MOSFET.

Figure 47:
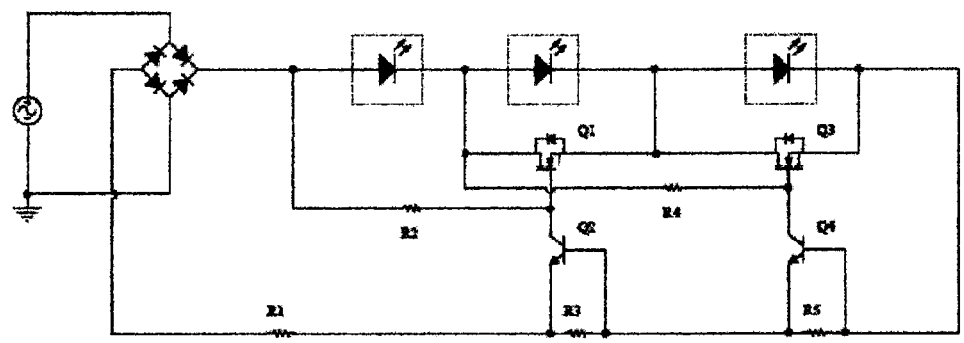
FIG. 47 depicts a schematic of an exemplary circuit for an LED light engine with selective current diversion to bypass two groups of LEDs while AC input excitation is below two corresponding predetermined levels.

FIG. 47 depicts a schematic of an exemplary circuit for an LED light engine with selective current diversion to bypass two groups of LEDs while AC input excitation is below two corresponding predetermined levels. The light engine circuit of FIG. 47 adds an additional group of LEDs and a corresponding additional bypass circuit to the light engine circuit of FIG. 46. Various embodiments may advantageously provide for two or more bypass circuits, for example, to permit additional degrees of freedom in constructing a more sinusoidal-shaped current waveform. Additional degrees of freedom may yield further potential improvements to power factor and further reduced harmonic distortion for a given peak illumination output from the LEDs.

Figure 48A:
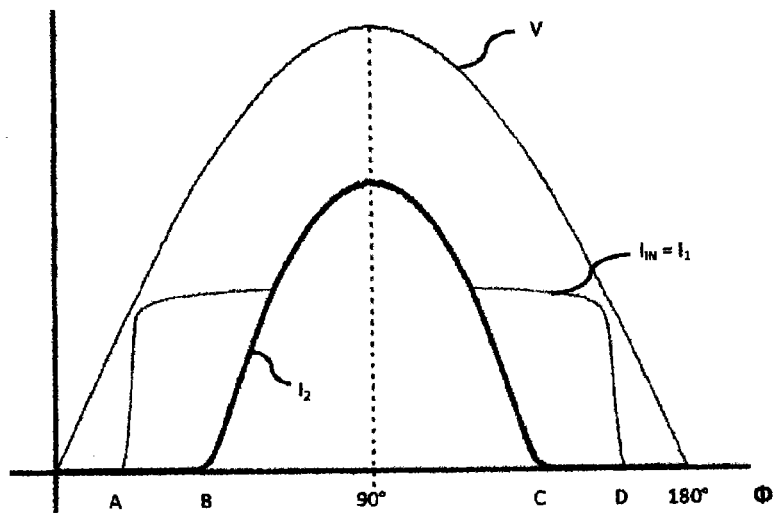
FIGS. 48A-48C depict exemplary electrical and light performance parameters for the light engine circuit of, for example, FIG. 46.
Figure 48B:
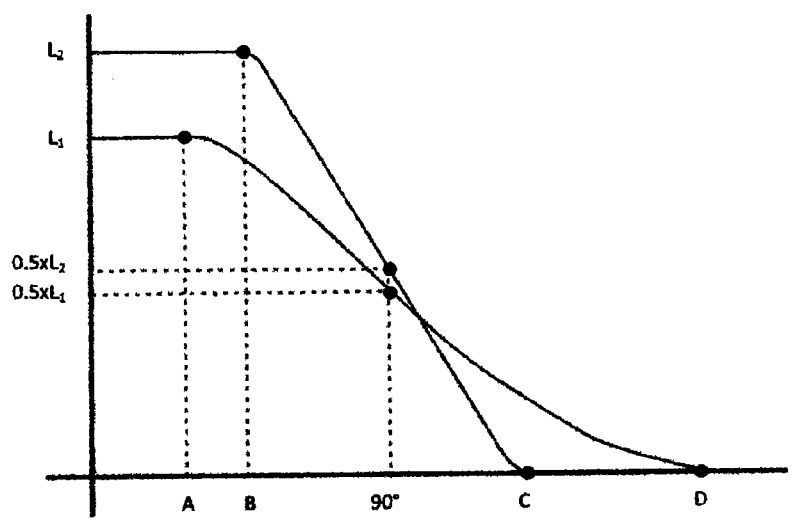
Figure 48C:
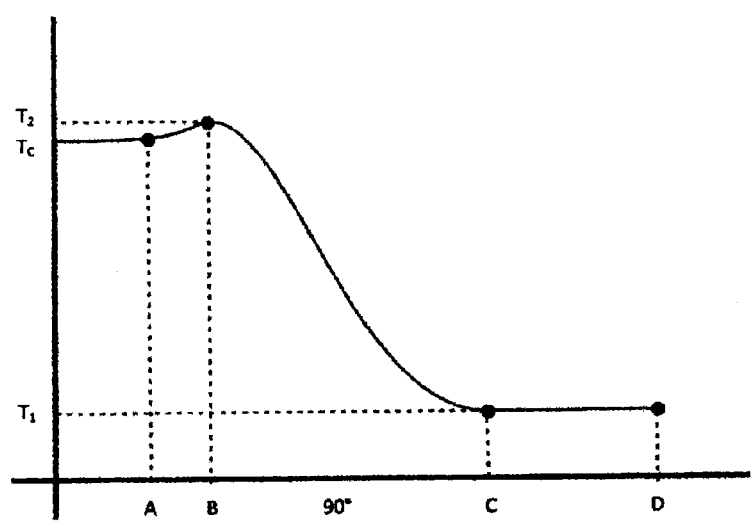

FIGS. 48A-48C depict exemplary electrical and light performance parameters for the light engine circuit of, for example, FIG. 46.

FIG. 48A depicts illustrative voltage and current waveforms for the light engine circuit of FIG. 46. The graph labeled V plots the AC input excitation voltage, which is depicted as a sinusoidal waveform. The plot labeled Iin=I1 shows an exemplary current waveform for the input current, which in this circuit, is the same as the current through LEDs1. A plot labeled I2 represents a current through the LEDs2.

During a typical half-cycle, LEDs1 do not conduct until the AC input excitation voltage substantially overcomes the effective forward turn on for the diodes in the circuit. When the phase reaches A in the cycle, current starts to flow through the LEDs1 and the bypass switch. Input current increase until the bypass circuit begins to turn off the MOSFET at B. In some examples, the MOSFET may behave in a linear region (e.g., unsaturated, not rapidly switching between binary states) as the current divides between the MOSFET channel and the LEDs2. The MOSFET current may fall to zero as the current I2 through LEDs2 approaches the input current. At the peak input voltage excitation, the peak light output is reached. These steps occur in reverse after the AC input excitation voltage passes its peak and starts to fall.

FIG. 48B depicts an illustrative plot of exemplary relationships between luminance of the LEDs1 and LEDs2 in response to phase control (e.g., dimming). The relative behavior of output luminance of each of LEDs1 and LEDs2 will be reviewed for progressively increasing phase cutting, which corresponds to dimming.

At the origin and up to conduction angle A, phase control does not attenuate any current flow through LEDs1 or LEDs2. Accordingly, the LEDs1 maintains its peak luminance L1, and the LEDs2 maintains its peak luminance L2.

When the phase control delays conduction for angles between A and B, an average luminance of LEDs1 is decreased, but the phase control does not impact the current profile through LEDs2, so LEDs2 maintains luminance L2.

When the phase control delays conduction for angles between B and C, an average luminance of LEDs1 continues to fall as the increase in phase cutting continues to shorten the average illumination time of the LEDs1. The phase control also begins to shorten the average conduction time of the LEDs2, so L2 luminance falls toward zero as the phase control turn-on delay approaches C.

When the phase control delays conduction for angles between C and D, the phase controller completely blocks current during the time the excitation input level is above the threshold required to turn off the bypass switch. As a consequence, LEDs2 never carries current and thus outputs no light. LEDs1 output continues to fall toward zero at D.

At phase cutting beyond D, the light engine puts out substantially no light because the excitation voltage levels supplied by the phase controller are not sufficient to overcome the effective forward turn on voltage of the LEDs1.

FIG. 48C depicts an exemplary composite color temperature characteristic under phase control for the LED light engine of FIG. 46. In this example, LEDs1 and LEDs2 that have different color temperatures, T1 and T2, respectively. The luminance behavior of LEDs1 and LEDs2 as described with reference to FIG. 48B indicates that an exemplary light engine can shift its output color as it is dimmed. In an illustrative example, the color temperature may shift from a cool white toward a warmer red or green as the intensity is dimmed by, for example, a conventional phase-cutting dimmer control.

At the origin and up to conduction angle A, phase control does not attenuate the illuminance of LEDs1 or LEDs2. Accordingly, the light engine may output a composite color temperature in accordance with a combination of the component color temperatures according to their relative intensities.

When the phase control delays conduction for angles between A and B, an average color temperature increases as the luminance of the low color temperature LEDs1 is decreased (see FIG. 48B).

When the phase control delays conduction for angles between B and C, the color temperature falls relatively rapidly as the increased phase cutting attenuates the higher color temperature toward zero. In this range, the lower color temperature LEDs1 falls relatively slowly, but not to zero.

When the phase control delays conduction for angles between C and D, the only contributing color temperature is T1, so the color temperature remains constant as the luminance of LEDs1 falls toward zero at D.

The example of FIG. 48C may cover embodiments in which the different color LEDs are spatially oriented and located to yield a composite color output. By way of an example, multiple colors of LEDs may be arranged to form a beam in which the illumination from each LED color substantially shares a common orientation and direction with other colors.

In light of the foregoing, it may be seen that composite color temperature may be manipulated by controlling current flow through or diverting away from selected groups of LEDs. In various examples, manipulation of current flow through groups of LEDs may be automatically performed by one or more bypass circuits configured to respond to predetermined AC excitation levels. Moreover, various embodiments have been described that selectively divert current to improve power factor and/or reduce harmonic distortion, for example, for a given peak output illumination level. Bypass circuits have been described herein that may be advantageously implemented with existing LED modules or integrated into an LED module to form an LED light engine with only a small number of components, with low power losses, and low overall cost.

FIGS. 49A-49C, 50A-50C, and 51A-51C depict performance plots of three exemplary AC LED light engines with selective current diversion conditioning circuitry configured to shift color temperature as a function of excitation voltage. In these experiments, each of the three light engines was excited with amplitude modulated sinusoidal voltage source operating at 60 Hz. The tested lamps were exemplary implementations of the circuit as generally depicted in FIG. 26 or 38. Measurements of correlated color temperature (CCT) and spectral intensity were recorded at five Volt increments up to the rated voltage for each lamp under test.

Figure 49A:
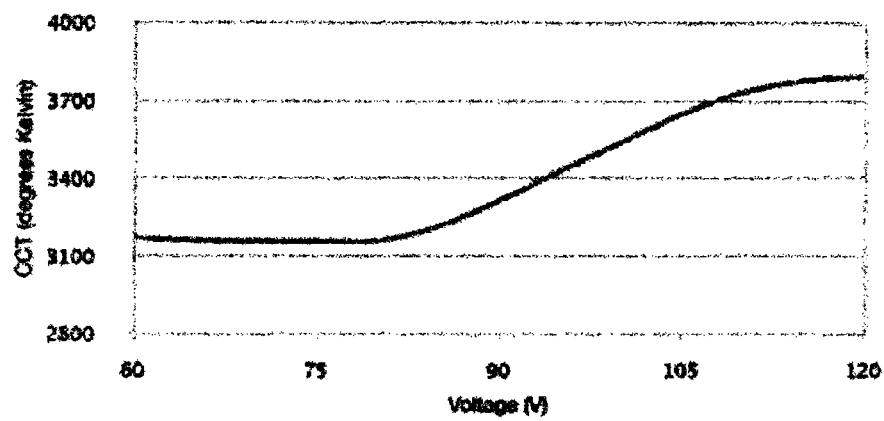
FIGS. 49A-49C, 50A-50C, and 51A-51C depict performance plots of three exemplary AC LED light engines with selective current diversion conditioning circuitry configured to shift color temperature as a function of excitation voltage.
Figure 49B:
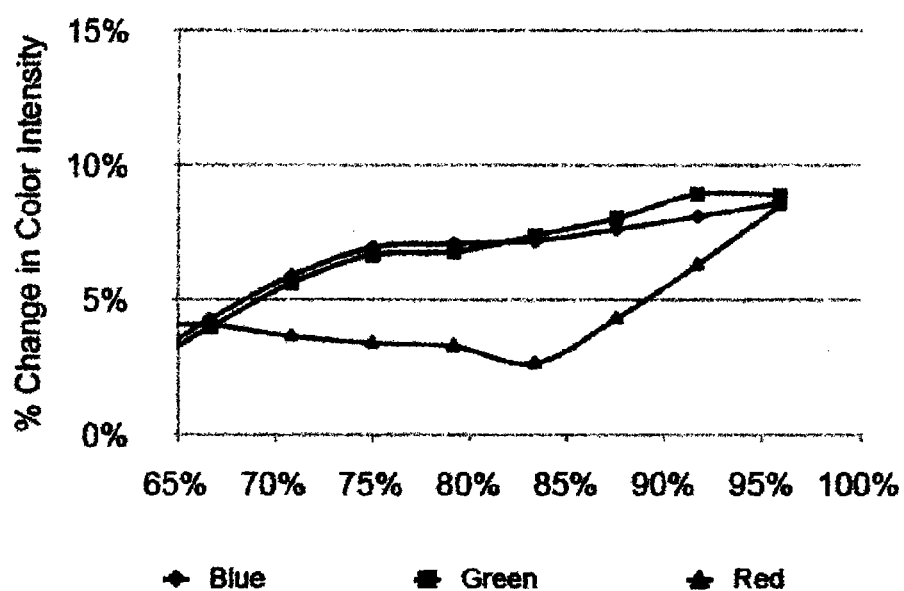
Figure 49C:
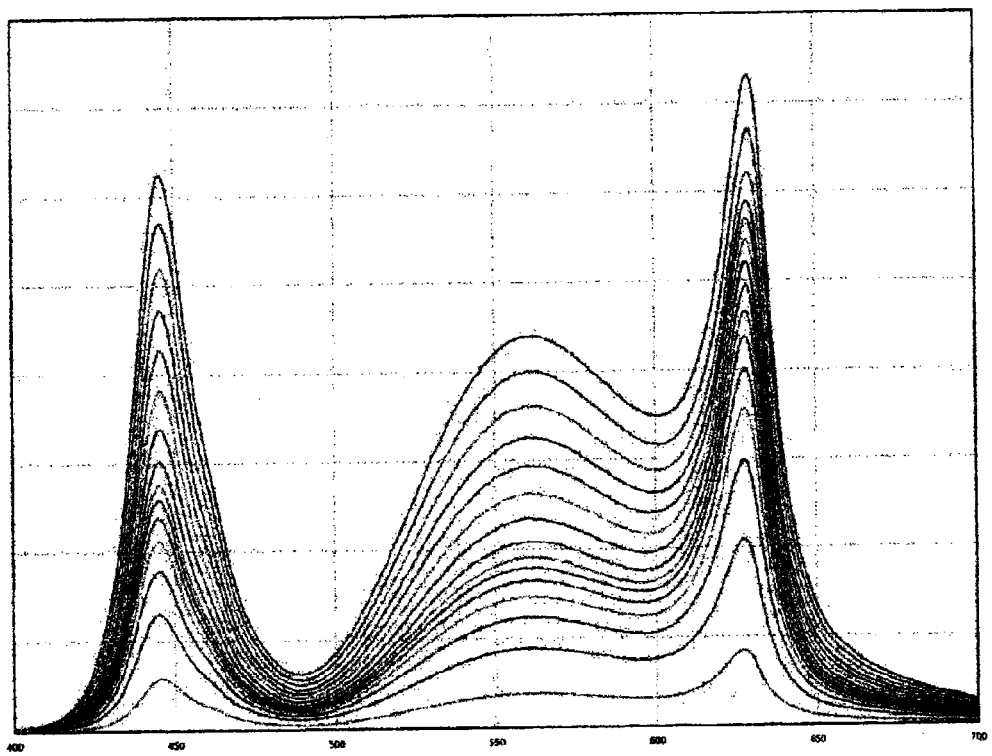

FIGS. 49A-49C represent measurement data for an exemplary lamp with a light engine that included red and white LEDs in LED Group 1, and white LEDs in LED Group 2. FIG. 49A shows that the color temperature value fell from about 3796 K at 120 V to about 3162 K at 80 V (voltages are in r.m.s.). This represents a 16.7% decrease in color temperature value. This may be referred to herein as a shift to a warmer color in response to amplitude modulation of the sinusoidal input voltage excitation. Although not shown in these experiments, generally similar operation may be expected from phase-cut modulation to reduce the effective AC input voltage excitation.

FIG. 49B shows that, for dimming from 100% down to 60% of rated excitation voltage, the peak intensity at a red wavelength (630 nm) decreased at a substantially slower rate than the peak intensity wavelengths for blue (446 nm) and green (563 nm). From 90% down to 70% of rated voltage, the blue and green wavelength intensities fell at between about 5-9% for every 5 V reduction in input voltage, whereas the red dropped at about 3-5% for every 5 V reduction in input voltage. From around 83% down to about 75% of rated input voltage, the rate of decrease of the peak green and blue intensities was at least 2.0 times the rate of decrease of the peak red intensity. Accordingly, the relative intensity of the red wavelength in this embodiment increased automatically and substantially smoothly in response to reduced input excitation voltage, as the input voltage is decreased in a range from the rated excitation. In this example, the range extended down to at least 70% rated voltage. Below that point, it is believed that the LEDs in LED Group 2 may be in a substantially non-conducting state while the LEDs in LED Group 1 are conducting and continuing to decrease in light output as voltage is further reduced.

FIG. 49C shows spectral intensity measurements from 400 nm to 700 nm for the lamp tested at 5 V increments up to the rated voltage. As voltage is reduced, the intensity of all wavelengths fall, but not at the same rate, in accordance with the discussion above with reference to FIGS. 49A-49B. The peak intensities discussed with reference to FIG. 49B were selected as the three local maxima at full input voltage excitation.

Figure 50A:
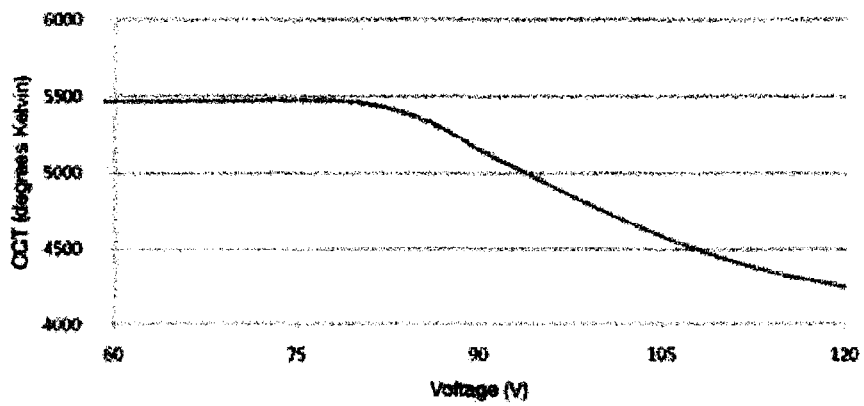
Figure 50B:
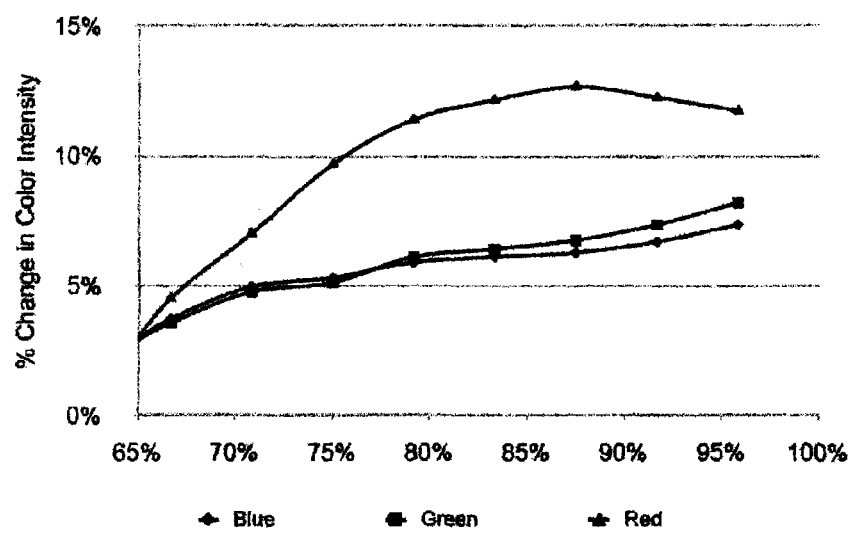
Figure 50C:
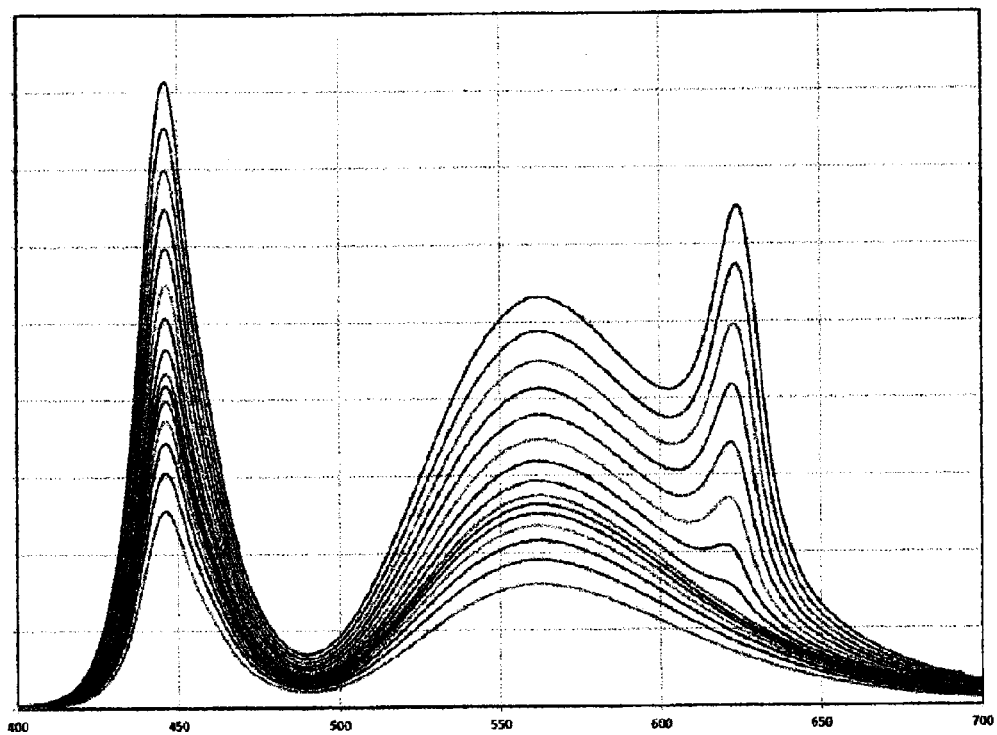

FIGS. 50A-50C represent measurement data for an exemplary lamp with a light engine that included white LEDs in LED Group 1, and red and white LEDs in LED Group 2. FIG. 50A shows that the color temperature value rose from about 4250 K at 120 V to about 5464 K at 60 V (voltages are in r.m.s.). This represents a 28.5% increase in color temperature value. This may be referred to herein as a shift to a cooler color (e.g., dim to cool white) in response to amplitude modulation of the sinusoidal input voltage excitation. Although not shown in these experiments, generally similar operation may be expected from phase-cut modulation to reduce the effective AC input voltage excitation.

FIG. 50B shows that, for dimming from 100% down to 75% of rated excitation voltage, the peak intensity at a green (560 nm) wavelength decreased at a substantially slower rate than the peak intensity wavelengths for blue (446 nm) and red wavelength (624 nm). From about 96% down to 75% of rated voltage, the blue and red wavelength intensities fell at between about 6-13% for every 5 V reduction in input voltage, whereas the green dropped at about 2-10% for every 5 V reduction in input voltage. From around 96% down to about 75% of rated input voltage, the rate of decrease of the peak red and blue intensities ranged from about 37% higher to about 300% of the rate of decrease of the peak green intensity. Accordingly, the relative intensity of the green wavelength in this embodiment increased automatically and substantially smoothly in response to reduced input excitation voltage, as the input voltage is decreased in a range from the rated excitation. In this example, the range extended down to about 75% rated voltage. Below that point, it is believed that the LEDs in LED Group 2 may enter a substantially non-conducting state while the LEDs in LED Group 1 are conducting and continuing to decrease in light output as voltage is further reduced.

Figure 51A:
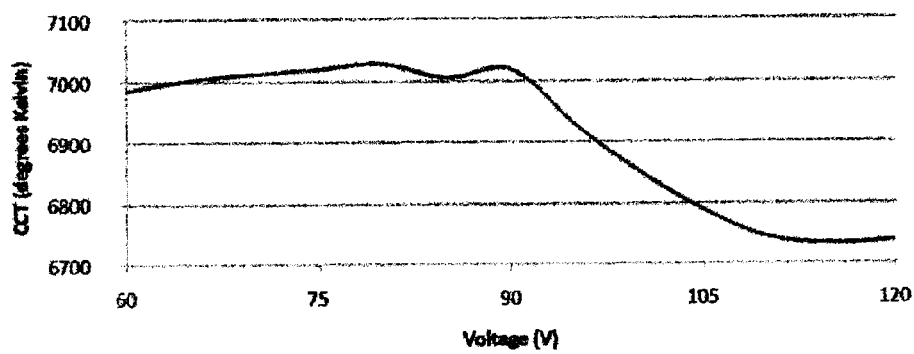
Figure 51B:
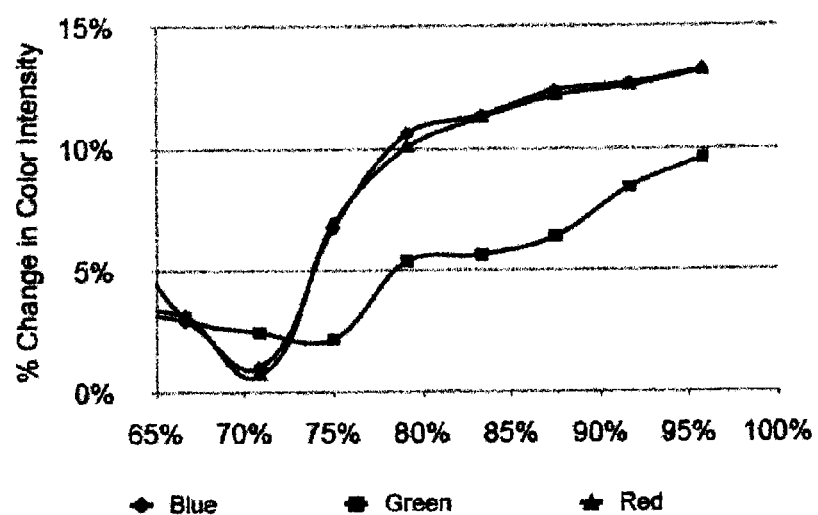
Figure 51C:
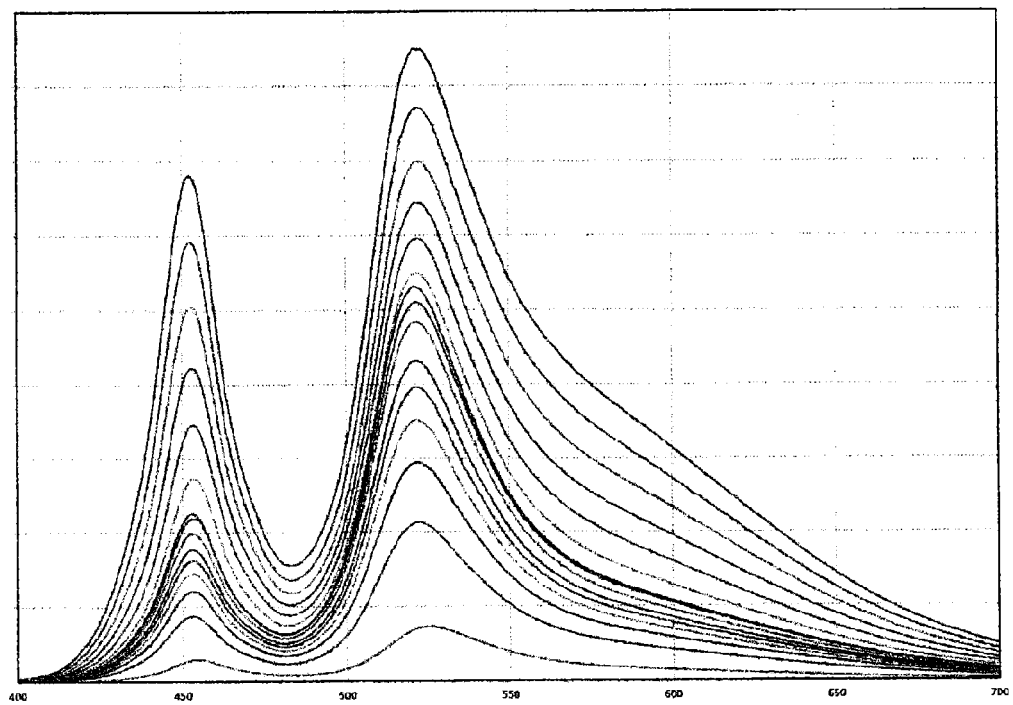

FIG. 51C shows spectral intensity measurements from 400 nm to 700 nm for the lamp tested at 5 V increments up to the rated voltage. As voltage is reduced, the intensity of all wavelengths fall, but not at the same rate, in accordance with the discussion above with reference to FIGS. 51A-51B. The peak intensities discussed with reference to FIG. 51B were selected as the local maxima at full input voltage excitation.

FIGS. 51A-51C represent measurement data for an exemplary lamp with a light engine that included green and white LEDs in LED Group 1, and white LEDs in LED Group 2. FIG. 51A shows that the color temperature value rose from about 6738 K at 120 V to about 6985 K at 60 V (voltages are in r.m.s.). This represents a 3.6% increase in color temperature value. This may be referred to herein as a shift to a cooler color in response to amplitude modulation of the sinusoidal input voltage excitation. Although not shown in these experiments, generally similar operation may be expected from phase-cut modulation to reduce the effective AC input voltage excitation.

FIG. 51B shows that, for dimming from 100% down to 65% of rated excitation voltage, the peak intensity at a peak intensity red wavelength (613 nm) decreased at a substantially faster rate than the peak intensity wavelengths for blue (452 nm) and green (521 nm). From about 96% down to 70% of rated voltage, the blue and green wavelength intensities fell at between about 3-8% for every 5 V reduction in input voltage, whereas the red dropped at about 7-12% for every 5 V reduction in input voltage. From around 96% down to about 71% of rated input voltage, the rate of decrease of the peak red intensity was about 40% higher than the rate of decrease of the peak green and blue intensities. Accordingly, the relative intensity of the red wavelength in this embodiment decreased automatically and substantially smoothly in response to reduced input excitation voltage, as the input voltage is decreased in a range from the rated excitation. In this example, the range extended down to about 65% rated voltage. Below that point, it is believed that the LEDs in LED Group 2 may enter a substantially non-conducting state while the LEDs in LED Group 1 are conducting and continuing to decrease in light output as voltage is further reduced.

FIG. 51C shows spectral intensity measurements from 400 nm to 700 nm for the lamp tested at 5 V increments up to the rated voltage. As voltage is reduced, the intensity of all wavelengths fall, but not at the same rate, in accordance with the discussion above with reference to FIGS. 51A-51B. The peak intensities discussed with reference to FIG. 51B were selected as the three local maxima at full input voltage excitation except that the red wavelength was selected without an available local intensity maximum point.

Accordingly, it may be appreciated from the disclosure herein that color temperature shifting as a function of input excitation waveforms may be implemented or designed based on appropriate selection of LED groups and arrangement of one or more selective current diversion conditioning circuits to modulate a bypass current around selected LED groups. The selection of the number of diodes in each group, excitation voltage, phase control range, diode colors, and peak intensity parameters may be manipulated to yield improved electrical and/or light output performance for a range of lighting applications.

Although various embodiments have been described with reference to the figures, other embodiments are possible. For example, some bypass circuits implementations may be controlled in response to signals from analog or digital components, which may be discrete, integrated, or a combination of each. Some embodiments may include programmed and/or programmable devices (e.g., PLAs, PLDs, ASICs, microcontroller, microprocessor), and may include one or more data stores (e.g., cell, register, block, page) that provide single or multi-level digital data storage capability, and which may be volatile and/or non-volatile. Some control functions may be implemented in hardware, software, firmware, or a combination of any of them.

Computer program products may contain a set of instructions that, when executed by a processor device, cause the processor to perform prescribed functions. These functions may be performed in conjunction with controlled devices in operable communication with the processor. Computer program products, which may include software, may be stored in a data store tangibly embedded on a storage medium, such as an electronic, magnetic, or rotating storage device, and may be fixed or removable (e.g., hard disk, floppy disk, thumb drive, CD, DVD).

The number of LEDs in each of the various embodiments is exemplary, and is not meant as limiting. The number of LEDs may be designed according to the forward voltage drop of the selected LEDs and the applied excitation amplitude supplied from the source. With reference to FIG. 26, for example, the number of LEDs in the LED Groups 1, 2 between nodes A, C may be reduced to achieve an improved power factor. The LEDs between nodes A, C may be advantageously placed in parallel to substantially balance the loading of the two sets of LEDs according to their relative duty cycle, for example, with respect to the loading of the LED Group 3. In some implementations, current may flow from node A to C whenever input current is being drawn from the source, while the current between nodes C and B may flow substantially only around peak excitation. In various embodiments, apparatus and methods may advantageously improve power factor without introducing substantial resistive dissipation in series with the LED string.

In an exemplary embodiment, one or more of the LEDs in the lighting apparatus may have different colors and/or electrical characteristics. For example, the rectifier LEDs (which carry current only during alternating half cycles) of the embodiment of FIG. 6 may have a different color temperature than the load LEDs that carry the current during all four quadrants.

In accordance with another embodiment, additional components may be included, for example, to reduce reverse leakage current through the diodes. For example, a low reverse leakage rectifier that is not an LED may be included in series with both branches of the rectifier to minimize reverse leakage in the positive and negative current paths in the rectifier.

In accordance with another embodiment, AC input to the rectifier may be modified by other power processing circuitry. For example, a dimmer module that uses phase-control to delay turn on and/or interrupt current flow at selected points in each half cycle may be used. In some cases, harmonic improvement may still advantageously be achieved even when current is distorted by the dimmer module. Improved power factor may also be achieved where the rectified sinusoidal voltage waveform is amplitude modulated by a dimmer module, variable transformer, or rheostat, for example.

In one example, the excitation voltage may have a substantially sinusoidal waveform, such as line voltage at about 120 VAC at 50 or 60 Hz. In some examples, the excitation voltage may be a substantially sinusoidal waveform that has been processed by a dimming circuit, such as a phase-controlled switch that operates to delay turn on or to interrupt turn off at a selected phase in each half cycle. In some examples, the dimmer may modulate the amplitude of the AC sinusoidal voltage (e.g., AC-to-AC converter), or modulate the rectified sinusoidal waveform (e.g., DC-to-DC converter).

Line frequencies may include about 50, about 60, about 100, or about 400 Hz, for example. In some embodiments, the fundamental operating frequency may be substantially below 1 kHz, which may advantageously reduce problems with exceeding permissible radio frequency emissions which may be associated with harmonic currents.

In some embodiments the substantially smooth linear waveforms during operation may advantageously yield substantially negligible harmonic levels. Some examples may emit conducted or radiated emissions at such low levels and at such low frequencies that they may be considered to be substantially negligible in the audio or RF range. Some embodiments may require substantially no filtering components to meet widely applicable standards that may typically govern conducted or radiated electromagnetic emissions, such as those that may apply to residential or commercial lighting products. For example, various embodiments may advantageously operate in residential or commercial applications without filter components, such as capacitors (e.g., aluminum electrolytic), inductors, chokes, or magnetic or electric field absorption or shielding materials. Accordingly, such embodiments may advantageously provide high efficiency, dimmable lighting without the cost, weight, packaging, hazardous substances, and volume associated with such filter components.

In some implementations, bypass circuitry may be manufactured on a single die integrated with some or all of the illuminating LED. For example, an AC LED module may include a die that includes one or more of the LEDs in the group that is to be bypassed, and may further include some or all of the bypass circuit components and interconnections. Such implementations may substantially further reduce assembly and component cost by reducing or substantially eliminating placement and wiring associated with embodiments of the bypass circuit. For example, integration of the bypass circuitry with the LEDs on the same die or hybrid circuit assembly may eliminate at least one wire or one interface electrical connection. In an illustrative example, the electrical interface between the bypass circuit and the LED on separate substrates may involve a wire or other interconnect (e.g., board-to-board header) to permit current diversion to the bypass circuit and away from the LEDs to be bypassed. In integrated embodiments, the space for component placement and/or interconnect routing for the bypass path may be substantially reduced or eliminated, further fostering cost reductions and miniaturization of a complete AC LED light engine.

As generally used herein for sinusoidal excitation, conduction angle refers to the portion (as measured in degrees) of a (180 degrees for a half-cycle) rectified sinusoidal waveform during which substantial excitation input current flows into one or more of the LEDs in the load to cause the LEDs to emit light. As an illustration, a resistive load may have a 180 degree conduction angle. A typical LED load may exhibit a conduction angle less than 180 degrees due to the forward turn-on voltage of each diode.

In an illustrative example, the AC input may be excited with, for example, a nominally 120 Volt sinusoidal voltage at 60 Hz, but it is not limited to this particular voltage, waveform, or frequency. For example, some implementations may operate with AC input excitation of 115 Volts square wave at 400 Hz. In some implementations, the excitation may be substantially unipolar (rectified) sinusoidal, rectangular, triangular or trapezoidal periodic waveforms, for example. In various embodiments, the peak voltage of the AC excitation may be about 46, 50, 55, 60, 65, 70, 80, 90, 100, 110, 115, 120, 125, 130, 140, 150, 160, 170, 180, 190, 200, 210, 220, 230, 240, 260, 280, 300, 350, 400, 500, 600, 800, 1000, 1100, 1300, or at least about 1500 Volts.

An exemplary dimmer module may operate in response to user input via a sliding control, which may be coupled to a potentiometer. In other embodiments, the user control input may be augmented or replaced with one or more other inputs. For example, the AC excitation supplied to the light engine may be modulated in response to automatically generated analog and/or digital inputs, alone or in combination with input from a user. For example, a programmable controller may supply a control signal to establish an operating point for the dimmer control module.

An exemplary dimmer module may include a phase control module to control what portion of the AC excitation waveform is substantially blocked from supply to terminals of an exemplary light engine circuit. In other embodiments, the AC excitation may be modulated using one or more other techniques, either alone or in combination. For example, pulse-width modulation, alone or in combination with phase control, may be used to module the AC excitation at modulation frequency that is substantially higher than the fundamental AC excitation frequency.

In some examples, modulation of the AC excitation signal may involve a de-energized mode in which substantially no excitation is applied to the light engine. Accordingly, some implementations may include a disconnect switch (e.g., solid state or mechanical relay) in combination with the excitation modulation control (e.g., phase control module). The disconnect switch may be arranged in series to interrupt the supply connection of AC excitation to the light engine. In some examples, a disconnect switch may be provided on a circuit breaker panel that receives AC input from an electrical utility source and distributes the AC excitation to the dimmer module. In some examples, the disconnect switch may be arranged at a different node in the circuit than the node in the circuit breaker panel. Some examples may include the disconnect switch arranged to respond to an automated input signal (e.g., from a programmable controller) and/or to a user input element being placed into a predetermined position (e.g., moved to an end of travel position, pushed in to engage a switch, or the like).

Some embodiments may provide a desired intensity and one or more corresponding color shift characteristics. Some embodiments may substantially reduce cost, size, component count, weight, reliability, and efficiency of a dimmable LED light source. In some embodiments, the selective current diversion circuitry may operate with reduced harmonic distortion and/or power factor on the AC input current waveform using, for example, very simple, low cost, and low power circuitry. Accordingly, some embodiments may reduce energy requirements for illumination, provide desired illumination intensity and color over a biological cycle using a simple dimmer control, and avoid illumination with undesired wavelengths. Some embodiments may advantageously be enclosed in a water-resistant housing to permit cleaning using pressurized cold water sprays. In several embodiments, the housing may be ruggedized, require low cost for materials and assembly, and provide substantial heat sinking to the LED light engine during operation. Various examples may include a lens to supply a substantially uniform and/or directed illumination pattern. Some embodiments may provide simple and low cost installation configurations that may include simple connection to a drop cord.

In some embodiments, the additional circuitry to achieve substantially reduced harmonic distortion may include a single transistor, or may further include a second transistor and a current sense element. In some examples, a current sensor may include a resistive element through which a portion of an LED current flows. In some embodiments, significant size and manufacturing cost reductions may be achieved by integrating the harmonic improvement circuitry on a die with one or more LEDs controlled by harmonic improvement circuitry. In certain examples, harmonic improvement circuitry may be integrated with corresponding controlled LEDs on a common die without increasing the number of process steps required to manufacture the LEDs alone. In various embodiments, harmonic distortion of AC input current may be substantially improved for AC-driven LED loads, for example, using either half-wave or full-wave rectification.

Although a screw type socket, which may sometimes be referred to as an "Edison-screw" style socket, may be used to make electrical interface to the LED light engine and provide mechanical support for the LED lamp assembly, other types of sockets may be used. Some implementations may use bayonet style interface, which may feature one or more conductive radially-oriented pins that engage a corresponding slot in the socket and make electrical and mechanically-supportive connection when the LED lamp assembly is rotated into position. Some LED lamp assemblies may use, for example, two or more contact pins that can engage a corresponding socket, for example, using a twisting motion to engage, both electrically and mechanically, the pins into the socket. By way of example and not limitation, the electrical interface may use a two pin arrangement as in commercially available GU-10 style lamps, for example.

In some implementations, a computer program product may contain instructions that, when executed by a processor, cause the processor to adjust the color temperature and/or intensity of lighting, which may include LED lighting. Color temperature may be manipulated by a composite light apparatus that combines one or more LEDs of one or more color temperatures with one or more non-LED light sources, each having a unique color temperature and/or light output characteristic. By way of example and not limitation, multiple color temperature LEDs may be combined with one or more fluorescent, incandescent, halogen, and/or mercury lights sources to provide a desired color temperature characteristic over a range of excitation conditions.

Although some embodiments may advantageously smoothly transition the light fixture output color from a cool color to a warm color as the AC excitation supplied to the light engine is reduced, other implementations are possible. For example, reducing AC input excitation may shift color temperature of an LED fixture from a relatively warm color to a relatively cool color, for example.

In some embodiments, materials selection and processing may be controlled to manipulate the LED color temperature and other light output parameters (e.g., intensity, direction) so as to provide LEDs that will produce a desired composite characteristic. Appropriate selection of LEDs to provide a desired color temperature, in combination with appropriate application and threshold determination for the bypass circuit, can advantageously permit tailoring of color temperature variation over a range of input excitation.

In some implementations, the amplitude of the excitation voltage may be modulated, for example, by controlled switching of transformer taps. In general, some combinations of taps may be associated with a number of different turns ratios. For example, solid state or mechanical relays may be used to select from among a number of available taps on the primary and/or secondary of a transformer so as to provide a turns ratio nearest to a desired AC excitation voltage.

In some examples, AC excitation amplitude may be dynamically adjusted by a variable transformer (e.g., variac) that can provide a smooth continuous adjustment of AC excitation voltage over an operating range. In some embodiments, AC excitation may be generated by a variable speed/voltage electro-mechanical generator (e.g., diesel powered). A generator may be operated with controlled speed and/or current parameters to supply a desired AC excitation to an LED-based light engine. In some implementations, AC excitation to the light engine may be provided using well-known solid state and/or electro-mechanical methods that may combine AC-DC rectification, DC-DC conversion (e.g., buck-boost, boost, buck, flyback), DC-AC inversion (e.g., half- or full-bridge, transformer coupled), and/or direct AC-AC conversion. Solid state switching techniques may use, for example, resonant (e.g., quasi-resonant, resonant), zero-cross (e.g., zero-current, zero-voltage) switching techniques, alone or in combination with appropriate modulation strategies (e.g., pulse density, pulse width, pulse-skipping, demand, or the like).

In an illustrative embodiment, a rectifier may receive an AC (e.g., sinusoidal) voltage and deliver substantially unidirectional current to LED modules arranged in series. An effective turn-on voltage of the LED load may be reduced by diverting current around at least one of the diodes in the string while the AC input voltage is below a predetermined level. In various examples, selective current diversion within the LED string may extend the input current conduction angle and thereby substantially reduce harmonic distortion for AC LED lighting systems.

In various embodiments, apparatus and methods may advantageously improve a power factor without introducing substantial resistive dissipation in series with the LED string. For example, by controlled modulation of one or more current paths through selected LEDs at predetermined threshold values of AC excitation, an LED load may provide increased effective turn on forward voltage levels for increased levels of AC excitation. For a given conduction angle, an effective current limiting resistance value to maintain a desired peak input excitation current may be accordingly reduced.

Various embodiments may provide substantially reduced light intensity modulation that may contribute to flicker, to the extent it may be potentially perceptible to humans or animals, by operating the LEDs to carry unidirectional current at twice the AC input excitation frequency. For example, a full-wave rectifier may supply 100 or 120 Hz load current (rectified sine wave), respectively, in response to 50 or 60 Hz sinusoidal input voltage excitation. The increased load frequency produces a corresponding increase in the flicker frequency of the illumination, which tends to push the flicker energy toward or beyond the level at which it can be perceived by humans or some animals. Moreover, some embodiments of a light engine with selective current diversion as described herein may substantially increase a conduction angle, which may correspondingly reduce a "dead time" during which no light is output by the LEDs. Such operation may further advantageously mitigate detectable light amplitude modulation effects, if any, in various embodiments.

Exemplary apparatus and associated methods may involve a bypass module for modulating conductivity of one or more current paths to provide a first set of LEDs that are conducting near minimum output illumination and having a larger conduction angle than that of a second set of LEDs that conduct at a maximum output illumination. In an illustrative example, the conductivity of a bypass path in parallel with a portion of the second set of LEDs may be reduced while the AC input excitation is above a predetermined threshold voltage or current. The bypass path may be operated to provide a reduced effective turn-on voltage while the input excitation is below the predetermined threshold. For a given maximum output illumination at a maximum input excitation, the bypass module may control current through selected LEDs to construct an input current waveform with substantially improved power factor and reduced harmonic distortion.

In various examples, the current modulation may extend an effective conduction angle of an input excitation current drawn from an electrical source.

In some examples, the modulation may draw an input excitation current constructed to substantially approximate a waveform and phase of a fundamental frequency of the input excitation voltage, which may result in an improved harmonic distortion and/or power factor. In an illustrative example, a turn-on voltage of an LED load may be reduced until the excitation input current or its associated periodic excitation voltage reaches a predetermined threshold level, and ceasing the turn-on voltage reduction while the excitation current or voltage is substantially above the predetermined threshold level.

Various embodiments may achieve one or more advantages. For example, some embodiments may be readily incorporated to provide improved electrical characteristics and/or dimming performance without redesigning existing LED modules. For examples, some embodiments can be readily implemented using a small number of discrete components in combination with existing LED modules. Some implementations may substantially reduce harmonic distortion on the AC input current waveform using, for example, very simple, low cost, and low power circuitry. In some embodiments, the additional circuitry to achieve substantially reduced harmonic distortion may include a single transistor, or may further include a second transistor and a current sense element. In some examples, a current sensor may be a resistive element through which a portion of an LED current flows. In some embodiments, significant size and manufacturing cost reductions may be achieved by integrating the harmonic improvement circuitry on a die with one or more LEDs controlled by harmonic improvement circuitry. In certain examples, harmonic improvement circuitry may be integrated with corresponding controlled LEDs on a common die without increasing the number of process steps required to manufacture the LEDs alone. In various embodiments, harmonic distortion of AC input current may be substantially improved for AC-driven LED loads, for example, using either half-wave or full-wave rectification.

Some embodiments may provide a number of parallel LED paths for LED groups to balance current loading among each path across all groups in approximate proportion to the root mean square of the current carried in that path at, for example, rated excitation. Such balancing may advantageously achieve substantially balanced degradation of the dies over the service lifetime of the AC LED light engine.

Apparatus and associated methods reduce harmonic distortion of a excitation current by diverting the excitation current substantially away from a number of LEDs arranged in a series circuit until the current or its associated periodic excitation voltage reaches a predetermined threshold level, and ceasing the current diversion while the excitation current or voltage is substantially above the predetermined threshold level. In an illustrative embodiment, a rectifier may receive an AC (e.g., sinusoidal) voltage and deliver unidirectional current to a string of series-connected LEDs. An effective turn-on threshold voltage of the diode string may be reduced by diverting current around at least one of the diodes in the string while the AC voltage is below a predetermined level. In various examples, selective current diversion within the LED string may extend the input current conduction angle and thereby substantially reduce harmonic distortion for AC LED lighting systems.

This document discloses technology relating to architecture for high power factor and low harmonic distortion of LED lighting systems. Related examples may be found in previously-filed disclosures that have common inventorship with this disclosure.

In some embodiments, implementations may be integrated with other elements, such as packaging and/or thermal management hardware. Examples of thermal or other elements that may be advantageously integrated with the embodiments described herein are described with reference, for example, to FIG. 15 in U.S. Publ. Application 2009/0185373 A1, filed by Z. Grajcar on Nov. 19, 2008, the entire contents of which are incorporated herein by reference.

Examples of technology for improved power factor and reduced harmonic distortion for color-shifting LED lighting under AC excitation are described with reference, for example, to FIGS. 20A-20C of U.S. Provisional Patent Application entitled "Reduction of Harmonic Distortion for LED Loads," Ser. No. 61/233,829, which was filed by Z. Grajcar on Aug. 14, 2009, the entire contents of which are incorporated herein by reference.

Examples of technology for dimming and color-shifting LEDs with AC excitation are described with reference, for example, to the various figures of U.S. Provisional Patent Application entitled "Color Temperature Shift Control for Dimmable AC LED Lighting," Ser. No. 61/234,094, which was filed by Z. Grajcar on Aug. 14, 2009, the entire contents of which are incorporated herein by reference.

Examples of a LED lamp assembly are described with reference, for example, to the various figures of U.S. Design patent application entitled "LED Downlight Assembly," Ser. No. 29/345,833, which was filed by Z. Grajcar on Oct. 22, 2009, the entire contents of which are incorporated herein by reference.

Various embodiments may incorporate one or more electrical interfaces for making electrical connection from the lighting apparatus to an excitation source. An example of an electrical interface that may be used in some embodiments of a downlight is disclosed in further detail with reference, for example, at least to FIG. 1-3, or 5 of U.S. Design patent application entitled "Lamp Assembly," Ser. No. 29/342,578, which was filed by Z. Grajcar on Oct. 27, 2009, the entire contents of which are incorporated herein by reference.

Further embodiments showing exemplary selective diversion circuit implementations, including integrated module packages, for AC LED light engines are described, for example, with reference at least to FIGS. 1, 2, 5A-5B, 7A-7B, and 10A-10B of U.S. Provisional Patent Application entitled "Architecture for High Power Factor and Low Harmonic Distortion LED Lighting," Ser. No. 61/255,491, which was filed by Z. Grajcar on Oct. 28, 2009, the entire contents of which are incorporated herein by reference.

Various embodiments may relate to dimmable lighting applications for livestock. Examples of such apparatus and methods are described with reference, for example, at least to FIGS. 3, 5A-6C of U.S. Provisional Patent Application entitled "LED Lighting for Livestock Development," Ser. No. 61/255,855, which was filed by Z. Grajcar on Oct. 29, 2009, the entire contents of which are incorporated herein by reference.

Some implementations may involve mounting an AC LED light engine to a circuit substrate using LEDs with compliant pins, some of which may provide substantial heat sink capability. Examples of such apparatus and methods are described with reference, for example, at least to FIGS. 11-12 of U.S. patent application entitled "Light Emitting Diode Assembly and Methods," Ser. No. 12/705,408, which was filed by Z. Grajcar on Feb. 12, 2010, the entire contents of which are incorporated herein by reference.

Further examples of technology for improved power factor and reduced harmonic distortion for color-shifting LED lighting under AC excitation are described with reference, for example, to FIGS. 21-43 of U.S. patent application entitled "Reduction of Harmonic Distortion for LED Loads," Ser. No. 12/785,498, which was filed by Z. Grajcar on May 24, 2010, the entire contents of which are incorporated herein by reference.

A number of embodiments have been described in various aspects with reference to the figures or otherwise.

In one exemplary aspect, a method of conditioning current in a light engine includes a step of providing a pair of input terminals adapted to receive an alternating polarity excitation voltage. The current flowing into each one of the pair of terminals is equal in magnitude and opposite in polarity. The method further includes providing a plurality of light emitting diodes (LEDs) arranged in a first network. The first network is arranged to conduct said current in response to the excitation voltage exceeding at least a forward threshold voltage associated with the first network. The method further includes providing a plurality of LEDs arranged in a second network in series relationship with said first network. The exemplary current conditioning method further includes a step of providing a bypass path in parallel with said second network and in series relationship with said first network. Another step is dynamically increasing an impedance of the bypass path as a substantially smooth and continuous function of said current amplitude in response to said current amplitude increasing in a range above a threshold current value; and, permitting said current to flow through said first network and substantially diverting said current away from said second network while a voltage drop across the bypass path is substantially below a forward threshold voltage associated with the second network.

In various examples, the method may include transitioning said current from said bypass path to second network in a substantially linear manner in response to the voltage drop across the bypass path increasing above the forward voltage of the second network. The step of selectively bypassing may further include permitting said current to flow through said first and second networks while the excitation voltage is above the second threshold. The step of selectively bypassing may further include substantially smoothly and continuously reducing current flow being diverted away from said second network in response to a substantially smooth and continuous increase in the excitation voltage magnitude above the second threshold. The step of selectively bypassing may also include receiving a control input signal indicative of a magnitude of said current.

The step may include varying an impedance of a path in parallel with the second network, wherein the impedance monotonically increases as the excitation voltage increases in at least a portion of a range between the first threshold and the second threshold. This step may further involve providing a low impedance path in parallel with the second network while the excitation voltage magnitude is at the first threshold or in at least a portion of a range between the first threshold and the second threshold. The step of selectively bypassing may include providing a substantially high impedance path in parallel with the second network while the excitation voltage is substantially above the second threshold.

In some embodiments, the method may include rectifying the excitation voltage received at the input terminals to a substantially unipolar voltage excitation to drive said current. The method may further include selective bypassing said current at a fundamental frequency that is an integer multiple of a frequency of the excitation voltage. The integer multiple may be at least three.

In another exemplary aspect, a light engine may include a pair of input terminals adapted to receive an alternating polarity excitation voltage. The current flowing into each one of the pair of terminals is equal in magnitude and opposite in polarity. The light engine includes a plurality of light emitting diodes (LEDs) arranged in a first network, said first network being arranged to conduct said current in response to the excitation voltage exceeding a first threshold of at least a forward threshold voltage magnitude associated with the first network. The light engine also includes a plurality of LEDs arranged in a second network in series with said first network. The second network is arranged to conduct said current in response to the excitation voltage exceeding a second threshold of at least the sum of the forward voltage magnitude associated with the first network and a forward voltage magnitude associated with the second network. It further includes means for selectively bypassing the second network by permitting the current to flow through the first network and substantially diverting the current away from the second network while the excitation voltage is below the second threshold.

By way of example, and not limitation, exemplary means for selectively bypassing are described herein with reference at least to FIGS. 19, 26, and 38-43.

In some embodiments, the selective bypassing means may further permit the current to flow through the first network and substantially divert the current away from the second network while the excitation voltage is within at least a portion of a range between the first threshold and the second threshold. The selective bypassing means may also permit current to flow through said first and second networks while the excitation voltage is above the second threshold. The selective bypassing means may further operate to substantially smoothly and continuously reduce current flow through the bypassing means in response to a substantially smooth and continuous increase in the excitation voltage magnitude above the second threshold.

In some examples, the selective bypassing means may include a control input responsive to a magnitude of the current. The selective bypassing means may be operable to present a variable impedance path in parallel with the second network such that the variable impedance monotonically increases as the excitation voltage increases in at least a portion of a range between the first threshold and the second threshold. The selective bypassing means may be operable to present a low impedance path in parallel with the second network while the excitation voltage magnitude is in at least a portion of a range between the first threshold and the second threshold. The selective bypassing means may be operable to present a substantially high impedance path in parallel with the second network while the excitation voltage is substantially above the second threshold.

In some embodiments, the light engine may further include a rectifier module to convert the excitation voltage received at the input terminals to a substantially unipolar voltage excitation to drive said current.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. An apparatus for a solid state light engine, the apparatus comprising:
a pair of terminals to receive an applied electrical excitation for a load;
a rectifier receiving the applied electrical excitation and supplying a unidirectional current to the load;
a first network in the load, wherein the first network includes a first plurality of light emitting diodes (LEDs) arranged in series connection to form a first current path for the unidirectional current supplied by the rectifier, the first plurality of LEDs having a first color characteristic;
a second network in the load, wherein the second network includes a second plurality of LEDs arranged in series connection to form a second current path for the unidirectional current supplied by the rectifier, the second plurality of LEDs having a second color characteristic that is substantially different from the first color characteristic;
a bypass path in parallel with said second network and in series relationship with said first network;
a controllable impedance element in the bypass path; and
a dynamic impedance control module coupled to the controllable impedance element, said dynamic impedance control module adapted to dynamically operate the controllable impedance element to increase an impedance of the bypass path as a substantially smooth and continuous function of said current amplitude in response to said current amplitude increasing above a threshold current value, and to permit said current to flow through said first network and to divert substantially all of said current away from said second network while a voltage drop across the bypass path is less than a forward threshold voltage associated with the second network, and smoothly and continuously transitioning substantially all of said current from said bypass path to said second network as said current increases in a substantially smooth and continuous manner while the voltage drop across the bypass path exceeds a forward threshold voltage associated with the second network,
wherein a color characteristic of the combined light output of the first and second networks varies between the first color characteristic and the second color characteristic as a function of the applied electrical excitation.

2. The apparatus of claim 1, wherein the controllable impedance element operates to substantially increase a measured color temperature in response to reduction in an applied voltage.

3. The apparatus of claim 2, wherein the reduction in the applied voltage is associated with a periodic voltage signal processed by a phase-cutting module.

4. The apparatus of claim 2, wherein the reduction in the applied voltage is associated with an amplitude modulated periodic voltage signal.

5. The apparatus of claim 2, wherein the color temperature increases by at least about 3% in response to reduction in the applied voltage.

6. The apparatus of claim 2, wherein the color temperature increases by at least about 28% in response to reduction in the applied voltage.

7. The apparatus of claim 1, wherein the controllable impedance element operates to substantially decrease a color temperature in response to reduction in an applied voltage.

8. The apparatus of claim 7, wherein the reduction in the applied voltage is associated with a periodic voltage signal processed by a phase-cutting module.

9. The apparatus of claim 7, wherein the reduction in the applied voltage is associated with an amplitude modulated periodic voltage signal.

10. The apparatus of claim 7, wherein the color temperature decreases by at least about 16% in response to reduction in the applied voltage.

11. The apparatus of claim 1, wherein the first network further comprises at least one string of one or more series-connected LEDs arranged in a parallel connection with the first current path.

12. The apparatus of claim 1, wherein the second network further comprises at least one string of one or more series-connected LEDs arranged in a parallel connection with the second current path.

13. The apparatus of claim 1, wherein the second network is connected in a series arrangement with the first network.

14. The apparatus of claim 1, wherein the second network is connected in a parallel arrangement with the first network.

15. The apparatus of claim 1, wherein the degree of current diversion by the controllable impedance element varies as a function of the applied electrical excitation.

16. The apparatus of claim 1, wherein the applied electrical excitation comprises a substantially sinusoidal voltage.

17. The apparatus of claim 1, wherein the applied electrical excitation comprises an alternating current.

* * * * *